United States Patent
Ruff et al.

(10) Patent No.: US 9,261,289 B2
(45) Date of Patent: *Feb. 16, 2016

(54) ADJUSTING PROXIMITY THRESHOLDS FOR ACTIVATING A DEVICE USER INTERFACE

(71) Applicant: Google Inc., Mountain View, CA (US)

(72) Inventors: Joseph Adam Ruff, San Jose, CA (US); Jonathan Solnit, Palo Alto, CA (US); Edwin H. Satterthwaite, Jr., Palo Alto, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/046,256

(22) Filed: Oct. 4, 2013

(65) Prior Publication Data

US 2014/0028551 A1    Jan. 30, 2014

Related U.S. Application Data

(63) Continuation of application No. 13/632,112, filed on Sep. 30, 2012, now Pat. No. 8,560,128, which is a continuation-in-part of application No. 13/267,877, filed on Oct. 6, 2011, now Pat. No. 9,026,254.

(Continued)

(51) Int. Cl.
*G05D 23/00*    (2006.01)
*F24F 11/00*    (2006.01)
(Continued)

(52) U.S. Cl.
CPC ............ *F24F 11/0034* (2013.01); *F24F 11/00* (2013.01); *F24F 11/001* (2013.01);
(Continued)

(58) Field of Classification Search
None
See application file for complete search history.

(56) References Cited

U.S. PATENT DOCUMENTS 3,991,357 A    11/1976    Kaminski
4,183,290 A    1/1980     Kucharczyk
(Continued)

FOREIGN PATENT DOCUMENTS

CA    2202008    2/2000
CN    201345134 Y    11/2009
(Continued)

OTHER PUBLICATIONS

International Preliminary Report on Patentability mailed Apr. 22, 2014 for International Patent Application No. PCT/US2012/058210 filed Sep. 30, 2012, 8 pages.

(Continued)

*Primary Examiner* — Ryan Jarrett
(74) *Attorney, Agent, or Firm* — Kilpatrick Townsend & Stockton LLP

(57) ABSTRACT

A smart-home device includes a user interface including an electronic display having a first display mode and a second display mode, the first display mode generally requiring more power than said second display mode. The device also includes a processing system in operative communication with one or more environmental sensors for determining at least one environmental condition. The device additionally includes at least one sensor configured to detect a physical closeness of a user to the at least one sensor. The processing system may be configured to cause the electronic display to be in the first display mode when a closeness threshold has been exceeded, where the processing system is further configured to automatically adjust the closeness threshold based at least in part on a historical plurality of physical closeness events as detected by the at least one sensor.

20 Claims, 14 Drawing Sheets

Related U.S. Application Data

(60) Provisional application No. 61/627,996, filed on Oct. 21, 2011, provisional application No. 61/415,771, filed on Nov. 19, 2010, provisional application No. 61/429,093, filed on Dec. 31, 2010.

(51) Int. Cl.

| | | |
|---|---|---|
| *G05D 23/19* | (2006.01) | |
| *G05D 23/27* | (2006.01) | |
| *G06F 3/0487* | (2013.01) | |
| *G05D 23/24* | (2006.01) | |
| *G01J 5/00* | (2006.01) | |
| *G01J 5/04* | (2006.01) | |
| *G06N 99/00* | (2010.01) | |
| *H04L 29/08* | (2006.01) | |
| *G01K 1/02* | (2006.01) | |
| *G05B 15/02* | (2006.01) | |
| *G05D 23/275* | (2006.01) | |

(52) U.S. Cl.
CPC ............ *F24F11/006* (2013.01); *F24F 11/0009* (2013.01); *F24F 11/0012* (2013.01); *F24F 11/0076* (2013.01); *F24F 11/0086* (2013.01); *G01J 5/0025* (2013.01); *G01J 5/041* (2013.01); *G01K 1/02* (2013.01); *G05B 15/02* (2013.01); *G05D 23/19* (2013.01); *G05D 23/1902* (2013.01); *G05D 23/1919* (2013.01); *G05D 23/1932* (2013.01); *G05D 23/24* (2013.01); *G05D 23/2434* (2013.01); *G05D 23/275* (2013.01); *G05D 23/2723* (2013.01); *G06F 3/0487* (2013.01); *G06N 99/005* (2013.01); *H04L 67/10* (2013.01); *F24F 2011/0035* (2013.01); *F24F 2011/0036* (2013.01); *F24F 2011/0071* (2013.01); *F24F 2011/0091* (2013.01); *Y02B 60/50* (2013.01); *Y02T 10/88* (2013.01)

(56) References Cited

U.S. PATENT DOCUMENTS

| | | |
|---|---|---|
| 4,223,831 A | 9/1980 | Szarka |
| 4,316,577 A | 2/1982 | Adams et al. |
| 4,335,847 A | 6/1982 | Levine |
| 4,408,711 A | 10/1983 | Levine |
| 4,460,125 A | 7/1984 | Barker et al. |
| 4,615,380 A | 10/1986 | Beckey |
| 4,674,027 A | 6/1987 | Beckey |
| 4,685,614 A | 8/1987 | Levine |
| 4,751,961 A | 6/1988 | Levine et al. |
| 4,768,706 A | 9/1988 | Parfitt |
| 4,897,798 A | 1/1990 | Cler |
| 5,005,365 A | 4/1991 | Lynch |
| 5,088,645 A | 2/1992 | Bell |
| 5,211,332 A | 5/1993 | Adams |
| 5,224,648 A | 7/1993 | Simon et al. |
| 5,240,178 A | 8/1993 | Dewolf et al. |
| 5,244,146 A | 9/1993 | Jefferson et al. |
| 5,294,047 A | 3/1994 | Schwer et al. |
| 5,395,042 A | 3/1995 | Riley et al. |
| 5,415,346 A | 5/1995 | Bishop |
| 5,476,221 A | 12/1995 | Seymour |
| 5,482,209 A | 1/1996 | Cochran et al. |
| 5,485,954 A | 1/1996 | Guy et al. |
| 5,499,196 A | 3/1996 | Pacheco |
| 5,555,927 A | 9/1996 | Shah |
| 5,603,451 A | 2/1997 | Helander et al. |
| 5,611,484 A | 3/1997 | Uhrich |
| 5,627,531 A | 5/1997 | Posso et al. |
| 5,673,850 A | 10/1997 | Uptegraph |
| 5,808,294 A | 9/1998 | Neumann |
| 5,808,602 A | 9/1998 | Sellers |
| 5,902,183 A | 5/1999 | D'Souza |
| 5,909,378 A | 6/1999 | De Milleville |
| 5,918,474 A | 7/1999 | Khanpara et al. |
| 5,931,378 A | 8/1999 | Schramm |
| 5,977,964 A | 11/1999 | Williams et al. |
| 6,032,867 A | 3/2000 | Dushane et al. |
| 6,062,482 A | 5/2000 | Gauthier et al. |
| 6,066,843 A | 5/2000 | Scheremeta |
| 6,072,784 A | 6/2000 | Agrawal et al. |
| 6,095,427 A | 8/2000 | Hoium et al. |
| 6,098,893 A | 8/2000 | Berglund et al. |
| 6,164,374 A | 12/2000 | Rhodes et al. |
| 6,206,295 B1 | 3/2001 | LaCoste |
| 6,213,404 B1 | 4/2001 | Dushane et al. |
| 6,216,956 B1 | 4/2001 | Ehlers et al. |
| 6,286,764 B1 | 9/2001 | Garvey et al. |
| 6,298,285 B1 | 10/2001 | Addink et al. |
| 6,349,883 B1 | 2/2002 | Simmons et al. |
| 6,356,204 B1 | 3/2002 | Guindi et al. |
| 6,370,894 B1 | 4/2002 | Thompson et al. |
| 6,415,205 B1 | 7/2002 | Myron et al. |
| 6,453,687 B2 | 9/2002 | Sharood et al. |
| 6,478,233 B1 | 11/2002 | Shah |
| 6,502,758 B2 | 1/2003 | Cottrell |
| 6,519,509 B1 | 2/2003 | Nierlich et al. |
| D471,825 S | 3/2003 | Peabody |
| 6,619,055 B1 | 9/2003 | Addy |
| 6,644,557 B1 | 11/2003 | Jacobs |
| 6,645,066 B2 | 11/2003 | Gutta et al. |
| 6,769,482 B2 | 8/2004 | Wagner et al. |
| 6,798,341 B1 | 9/2004 | Eckel et al. |
| 6,851,621 B1 | 2/2005 | Wacker et al. |
| D503,631 S | 4/2005 | Peabody |
| 6,891,838 B1 | 5/2005 | Petite et al. |
| 6,909,921 B1 | 6/2005 | Bilger |
| 6,951,306 B2 | 10/2005 | DeLuca |
| 6,990,821 B2 | 1/2006 | Singh et al. |
| 7,000,849 B2 | 2/2006 | Ashworth et al. |
| 7,024,336 B2 | 4/2006 | Salsbury et al. |
| 7,055,759 B2 | 6/2006 | Wacker et al. |
| 7,083,109 B2 | 8/2006 | Pouchak |
| 7,114,554 B2 | 10/2006 | Bergman et al. |
| 7,135,965 B2 | 11/2006 | Chapman, Jr. et al. |
| 7,141,748 B2 | 11/2006 | Tanaka et al. |
| 7,149,727 B1 | 12/2006 | Nicholls et al. |
| 7,149,729 B2 | 12/2006 | Kaasten et al. |
| 7,159,790 B2 | 1/2007 | Schwendinger et al. |
| 7,188,482 B2 | 3/2007 | Sadegh et al. |
| 7,258,280 B2 | 8/2007 | Wolfson |
| 7,264,175 B2 | 9/2007 | Schwendinger et al. |
| 7,287,709 B2 | 10/2007 | Proffitt et al. |
| 7,299,996 B2 | 11/2007 | Garrett et al. |
| 7,333,880 B2 | 2/2008 | Brewster et al. |
| D566,587 S | 4/2008 | Rosen |
| 7,379,791 B2 | 5/2008 | Tamarkin et al. |
| RE40,437 E | 7/2008 | Rosen |
| 7,434,742 B2 | 10/2008 | Mueller et al. |
| 7,451,937 B2 | 11/2008 | Flood et al. |
| 7,455,240 B2 | 11/2008 | Chapman, Jr. et al. |
| 7,460,690 B2 | 12/2008 | Cohen et al. |
| 7,469,550 B2 | 12/2008 | Chapman, Jr. et al. |
| 7,509,753 B2 | 3/2009 | Nicosia et al. |
| 7,555,364 B2 | 6/2009 | Poth et al. |
| 7,558,648 B2 | 7/2009 | Hoglund et al. |
| 7,571,865 B2 | 8/2009 | Nicodem et al. |
| 7,575,179 B2 | 8/2009 | Morrow et al. |
| 7,584,899 B2 | 9/2009 | de Pauw et al. |
| 7,600,694 B2 | 10/2009 | Helt et al. |
| D603,277 S | 11/2009 | Clausen et al. |
| 7,624,931 B2 | 12/2009 | Chapman, Jr. et al. |
| 7,634,504 B2 | 12/2009 | Amundson |
| 7,641,126 B2 | 1/2010 | Schultz et al. |
| 7,644,869 B2 | 1/2010 | Hoglund et al. |
| 7,693,582 B2 | 4/2010 | Bergman et al. |
| 7,702,424 B2 | 4/2010 | Cannon et al. |
| 7,703,694 B2 | 4/2010 | Mueller et al. |
| D614,976 S | 5/2010 | Skafdrup et al. |
| 7,726,581 B2 | 6/2010 | Naujok et al. |
| 7,784,704 B2 | 8/2010 | Harter |

(56) References Cited

U.S. PATENT DOCUMENTS

| | | |
|---|---|---|
| 7,802,618 B2 | 9/2010 | Simon et al. |
| 7,837,958 B2 | 11/2010 | Crapser et al. |
| 7,845,576 B2 | 12/2010 | Siddaramanna et al. |
| 7,848,900 B2 | 12/2010 | Steinberg et al. |
| 7,849,698 B2 | 12/2010 | Harrod et al. |
| 7,854,389 B2 | 12/2010 | Ahmed |
| 7,904,209 B2 | 3/2011 | Podgorny et al. |
| 7,904,830 B2 | 3/2011 | Hoglund et al. |
| 8,010,237 B2 | 8/2011 | Cheung et al. |
| 8,019,567 B2 | 9/2011 | Steinberg et al. |
| 8,037,022 B2 | 10/2011 | Rahman et al. |
| D651,529 S | 1/2012 | Mongell et al. |
| 8,090,477 B1 | 1/2012 | Steinberg |
| 8,091,375 B2 | 1/2012 | Crawford |
| 8,131,497 B2 | 3/2012 | Steinberg et al. |
| 8,174,381 B2 | 5/2012 | Imes et al. |
| 8,180,492 B2 | 5/2012 | Steinberg |
| 8,195,313 B1 | 6/2012 | Fadell et al. |
| 8,219,249 B2 | 7/2012 | Harrod et al. |
| 8,280,536 B1 | 10/2012 | Fadell et al. |
| 8,442,695 B2 | 5/2013 | Imes et al. |
| 8,560,128 B2 | 10/2013 | Ruff et al. |
| 2002/0005435 A1 | 1/2002 | Cottrell |
| 2003/0112262 A1 | 6/2003 | Adatia et al. |
| 2003/0231001 A1 | 12/2003 | Bruning |
| 2004/0034484 A1 | 2/2004 | Solomita, Jr. et al. |
| 2004/0249479 A1 | 12/2004 | Shorrock |
| 2004/0256472 A1 | 12/2004 | DeLuca |
| 2005/0043907 A1 | 2/2005 | Eckel et al. |
| 2005/0090915 A1 | 4/2005 | Geiwitz |
| 2005/0119793 A1 | 6/2005 | Amundson et al. |
| 2005/0125083 A1 | 6/2005 | Kiko |
| 2005/0128067 A1 | 6/2005 | Zakrewski |
| 2005/0150968 A1 | 7/2005 | Shearer |
| 2005/0159847 A1 | 7/2005 | Shah et al. |
| 2005/0189429 A1 | 9/2005 | Breeden |
| 2005/0192915 A1 | 9/2005 | Ahmed et al. |
| 2005/0194456 A1 | 9/2005 | Tessier et al. |
| 2005/0204997 A1 | 9/2005 | Fournier |
| 2005/0246408 A1 | 11/2005 | Chung |
| 2005/0270151 A1 | 12/2005 | Winick |
| 2005/0280421 A1 | 12/2005 | Yomoda et al. |
| 2006/0186214 A1 | 8/2006 | Simon et al. |
| 2006/0196953 A1 | 9/2006 | Simon et al. |
| 2006/0206220 A1 | 9/2006 | Amundson |
| 2006/0208099 A1 | 9/2006 | Chapman et al. |
| 2007/0001830 A1 | 1/2007 | Dagci et al. |
| 2007/0038787 A1 | 2/2007 | Harris et al. |
| 2007/0045430 A1 | 3/2007 | Chapman et al. |
| 2007/0045431 A1 | 3/2007 | Chapman, Jr. et al. |
| 2007/0045433 A1 | 3/2007 | Chapman et al. |
| 2007/0045444 A1 | 3/2007 | Gray et al. |
| 2007/0050732 A1 | 3/2007 | Chapman et al. |
| 2007/0084941 A1 | 4/2007 | de Pauw et al. |
| 2007/0114295 A1 | 5/2007 | Jenkins |
| 2007/0115902 A1 | 5/2007 | Shamoon et al. |
| 2007/0158442 A1 | 7/2007 | Chapman et al. |
| 2007/0173978 A1 | 7/2007 | Fein et al. |
| 2007/0205297 A1 | 9/2007 | Finkam et al. |
| 2007/0225867 A1 | 9/2007 | Moorer et al. |
| 2007/0227721 A1 | 10/2007 | Springer et al. |
| 2007/0228183 A1 | 10/2007 | Kennedy et al. |
| 2007/0241203 A1 | 10/2007 | Wagner et al. |
| 2007/0257120 A1 | 11/2007 | Chapman et al. |
| 2008/0015740 A1 | 1/2008 | Osann |
| 2008/0015742 A1 | 1/2008 | Kulyk et al. |
| 2008/0054082 A1 | 3/2008 | Evans et al. |
| 2008/0099568 A1 | 5/2008 | Nicodem et al. |
| 2008/0183335 A1 | 7/2008 | Poth et al. |
| 2008/0191045 A1 | 8/2008 | Harter |
| 2008/0215240 A1 | 9/2008 | Howard et al. |
| 2008/0245480 A1 | 10/2008 | Knight et al. |
| 2008/0273754 A1 | 11/2008 | Hick et al. |
| 2008/0290183 A1 | 11/2008 | Laberge et al. |
| 2008/0317292 A1 | 12/2008 | Baker et al. |
| 2009/0001180 A1 | 1/2009 | Siddaramanna et al. |
| 2009/0140056 A1 | 6/2009 | Leen |
| 2009/0140061 A1 | 6/2009 | Schultz et al. |
| 2009/0143916 A1 | 6/2009 | Boll et al. |
| 2009/0171862 A1 | 7/2009 | Harrod et al. |
| 2009/0194601 A1 | 8/2009 | Flohr |
| 2009/0254225 A1 | 10/2009 | Boucher et al. |
| 2009/0259713 A1 | 10/2009 | Blumrich et al. |
| 2009/0283603 A1 | 11/2009 | Peterson et al. |
| 2009/0297901 A1 | 12/2009 | Kilian et al. |
| 2009/0327354 A1 | 12/2009 | Resnick et al. |
| 2010/0019051 A1 | 1/2010 | Rosen |
| 2010/0025483 A1 | 2/2010 | Hoeynck et al. |
| 2010/0070084 A1 | 3/2010 | Steinberg et al. |
| 2010/0070086 A1 | 3/2010 | Harrod et al. |
| 2010/0070234 A1 | 3/2010 | Steinberg et al. |
| 2010/0084482 A1 | 4/2010 | Kennedy et al. |
| 2010/0107112 A1 | 4/2010 | Jennings et al. |
| 2010/0156608 A1 | 6/2010 | Bae et al. |
| 2010/0167783 A1 | 7/2010 | Alameh et al. |
| 2010/0168924 A1 | 7/2010 | Tessier et al. |
| 2010/0179704 A1 | 7/2010 | Ozog |
| 2010/0198425 A1 | 8/2010 | Donovan |
| 2010/0211224 A1 | 8/2010 | Keeling et al. |
| 2010/0262298 A1 | 10/2010 | Johnson et al. |
| 2010/0262299 A1 | 10/2010 | Cheung et al. |
| 2010/0273610 A1 | 10/2010 | Johnson |
| 2010/0280667 A1 | 11/2010 | Steinberg |
| 2010/0289643 A1 | 11/2010 | Trundle et al. |
| 2010/0301834 A1 | 12/2010 | Chemel et al. |
| 2010/0305771 A1 | 12/2010 | Rodgers |
| 2010/0308119 A1 | 12/2010 | Steinberg et al. |
| 2010/0318227 A1 | 12/2010 | Steinberg et al. |
| 2011/0001812 A1 | 1/2011 | Kang et al. |
| 2011/0015798 A1 | 1/2011 | Golden et al. |
| 2011/0015802 A1 | 1/2011 | Imes |
| 2011/0029488 A1 | 2/2011 | Fuerst et al. |
| 2011/0046792 A1 | 2/2011 | Imes et al. |
| 2011/0046805 A1 | 2/2011 | Bedros et al. |
| 2011/0046806 A1 | 2/2011 | Nagel et al. |
| 2011/0077896 A1 | 3/2011 | Steinberg et al. |
| 2011/0151837 A1 | 6/2011 | Winbush, III |
| 2011/0160913 A1 | 6/2011 | Parker et al. |
| 2011/0185895 A1 | 8/2011 | Freen |
| 2011/0307103 A1 | 12/2011 | Cheung et al. |
| 2011/0307112 A1 | 12/2011 | Barrilleaux |
| 2012/0017611 A1 | 1/2012 | Coffel et al. |
| 2012/0065935 A1 | 3/2012 | Steinberg et al. |
| 2012/0066168 A1 | 3/2012 | Fadell et al. |
| 2012/0085831 A1 | 4/2012 | Kopp |
| 2012/0101637 A1 | 4/2012 | Imes et al. |
| 2012/0130546 A1 | 5/2012 | Matas et al. |
| 2012/0158350 A1 | 6/2012 | Steinberg et al. |
| 2012/0179300 A1 | 7/2012 | Warren et al. |
| 2012/0221151 A1 | 8/2012 | Steinberg |
| 2012/0252430 A1 | 10/2012 | Imes et al. |
| 2013/0103207 A1 | 4/2013 | Ruff et al. |
| 2013/0226354 A9 | 8/2013 | Ruff et al. |

FOREIGN PATENT DOCUMENTS

| | | |
|---|---|---|
| CN | 101681460 A | 3/2010 |
| DE | 19609390 | 9/1997 |
| EP | 434926 | 7/1991 |
| EP | 196069 | 12/1991 |
| EP | 720077 | 7/1996 |
| EP | 802471 | 10/1997 |
| EP | 1065079 | 1/2001 |
| EP | 1398742 A1 | 3/2004 |
| EP | 1731984 | 12/2006 |
| EP | 2157492 | 2/2010 |
| GB | 2212317 | 5/1992 |
| JP | 59106311 | 6/1984 |
| JP | 01252850 | 10/1989 |
| JP | 09298780 | 11/1997 |
| JP | 2002087050 | 3/2002 |
| JP | 2003054290 | 2/2003 |
| NL | 1024986 | 6/2005 |
| WO | 0248851 | 6/2002 |

(56) References Cited

FOREIGN PATENT DOCUMENTS

| WO | 2008054938 | 5/2008 |
| --- | --- | --- |
| WO | 2009073496 | 6/2009 |
| WO | 2010077558 A2 | 7/2010 |
| WO | 2011128416 | 10/2011 |
| WO | 2013/058969 | 4/2013 |

OTHER PUBLICATIONS

European Search Report issued on Dec. 5, 2014 for European Patent Application No. 12841936.3 filed on Sep. 30, 2012, all pages.
Japanese Office Action mailed on Nov. 17, 2011 for Japanese Patent Application No. 2014-537088 filed on Sep. 30, 2012, all pages.
Aprilaire Electronic Thermostats Model 8355 User's Manual, Research Products Corporation, Dec. 2000, 16 pages.
Braeburn 5300 Installer Guide, Braeburn Systems, LLC, Dec. 9, 2009, 10 pages.
Braeburn Model 5200, Braeburn Systems, LLC, Jul. 20, 2011, 11 pages.
Ecobee Smart Si Thermostat Installation Manual, Ecobee, Apr. 3, 2012, 40 pages.
Ecobee. Smart Si Thermostat User Manual, Ecobee, Apr. 3, 2012, 44 pages.
Ecobee Smart Thermostat Installation Manual, Jun. 29, 2011, 20 pages.
Ecobee Smart Thermostat User Manual, May 11, 2010, 20 pages.
Electric Heat Lock Out on Heat Pumps, Washington State University Extension Energy Program, Apr. 2010, pp. 1-3.
Energy Joule, Ambient Devices, 2011, [retrieved on Aug. 1, 2012]. Retrieved from: http://web.archive.org/web/20110723210421/http://www.ambientdevices.com/products/energyjoule.html, 3 pages.
Honeywell CT2700, An Electronic Round Programmable Thermostat—User's Guide, Honeywell, Inc., 1997, 8 pages.
Honeywell CT8775A,C, The digital Round Non-Programmable Thermostats—Owner's Guide, Honeywell International Inc., 2003, 20 pages.
Honeywell Installation Guide FocusPRO TH6000 Series, Honeywell International, Inc., Jan. 5, 2012, 24 pages.
Honeywell Operating Manual FocusPRO TH6000 Series, Honeywell International, Inc., Mar. 25, 2011, 80 pages.
Honeywell Prestige IAQ Product Data 2, Honeywell International, Inc., Jan. 12, 2012, 126 pages.
Honeywell Prestige THX9321 and TXH9421 Product Data, Honeywell International, Inc., 68-0311, Jan. 2012, 126 pages.
Honeywell Prestige THX9321-9421 Operating Manual, Honeywell International, Inc., Jul. 6, 2011, 120 pages.
Honeywell T8700C, An Electronic Round Programmable Thermostat—Owner's Guide, Honeywell, Inc., 1997, 12 pages.
Honeywell T8775 The Digital Round Thermostat, Honeywell, 2003, 2 pages.
Honeywell T8775AC Digital Round Thermostat Manual No. 69-1679EF-1, www.honeywell.com/yourhome, Jun. 2004, pp. 1-16.
Hunter Internet Thermostat Installation Guide, Hunter Fan Co., Aug. 14, 2012, 8 pages.
ICY 3815TT-001 Timer-Thermostat Package Box, ICY BV Product Bar Code No. 8717953007902, 2009, 2 pages.
Introducing the New Smart Si Thermostat, Datasheet [online]. Ecobee, Mar. 2012 [retrieved on Feb. 25, 2013]. Retrieved from the Internet: <URL: http://www.ecobee.com/solutions/home/smart-si/>, Mar. 12, 2012, 4 pages.
Lennox ComfortSense 5000 Owners Guide, Lennox Industries, Inc., Feb. 2008, 32 pages.
Lennox ComfortSense 7000 Owners Guide, Lennox Industries, Inc., May 2009, 15 pages.
Lennox iComfort Manual, Lennox Industries, Inc., Dec. 2010, 20 pages.
Lux PSPU732T Manual, LUX Products Corporation, Jan. 6, 2009, 48 pages.
NetX RP32—WiFi Network Thermostat Consumer Brochure, Network Thermostat, May 2011, 2 pages.
NetX RP32—WiFi Network Thermostat Specification Sheet, Network Thermostat, Feb. 28, 2012, 2 pages.
RobertShaw Product Manual 9620, Maple Chase Company Jun. 12, 2001, 14 pages.
RobertShaw Product Manual 982512, Maple Chase Company, Jul. 17, 2006, 36 pages.
SYSTXCCUIZ01-V Infinity Control Installation Instructions, Carrier Corp, May 31, 2012, 20 pages.
T8611G Chronotherm IV Deluxe Programmable Heat Pump Thermostat Product Data, Honeywell International Inc., Oct. 1997, 24 pages.
TB-PAC, TB-PHP, Base Series Programmable Thermostats, Carrier Corp, May 14, 2012, 8 pages.
The Clever Thermostat, ICY BV Web Page, http://www.icy.nl/en/consumer/products/clever-thermostat, ICY BV, 2012, 1 page.
The Clever Thermostat User Manual and Installation Guide, ICY BV ICY3815 Timer-Thermostat, 2009, pp. 1-36.
The Perfect Climate Comfort Center PC8900A W8900A-C Product Data Sheet, Honeywell International Inc., Apr. 2001, 44 pages.
TP-PAC, TP-PHP, TP-NAC, TP-NHP Performance Series AC/HP Thermostat Installation Instructions, Carrier Corp, Sep. 2007, 56 pages.
Trane Communicating Thermostats for Fan Coil, Trane, May 2011, 32 pages.
Trane Communicating Thermostats for Heat Pump Control, Trane, May 2011, 32 pages.
Trane Install XL600 Installation Manual, Trane, Mar. 2006, 16 pages.
Trane XL950 Installation Guide, Trane, Mar. 2011, 20 pages.
Venstar T2900 Manual, Venstar, Inc., Apr. 2008, 113 pages.
Venstar T5800 Manual, Venstar, Inc., Sep. 7, 2011, 63 pages.
VisionPRO TH8000 Series Installation Guide, Honeywell International, Inc., Jan. 2012, 12 pages.
VisionPRO TH8000 Series Operating Manual, Honeywell International, Inc., Mar. 2011, 96 pages.
VisionPRO Wi-Fi Programmable Thermostat, Honeywell International, Inc., Operating Manual, Aug. 2012, 48 pages.
White Rodgers (Emerson) Model 1F81-261 Installation and Operating Instructions, White Rodgers, Apr. 15, 2010, 8 pages.
White Rodgers (Emerson) Model IF98EZ-1621 Homeowner's User Guide, White Rodgers, Jan. 25, 2012, 28 pages.
U.S. Appl. No. 60/512,886, Volkswagen Rotary Knob for Motor Vehicle—English Translation of German Application filed Oct. 20, 2003.
Akhlaghinia et al., "Occupancy Monitoring in Intelligent Environment through Integrated Wireless Localizing Agents", IEEE, 2009, 7 pages.
Akhlaghinia et al., "Occupant Behaviour Prediction in Ambient Intelligence Computing Environment", Journal of Uncertain Systems, vol. 2, No. 2, 2008, pp. 85-100.
Allen et al., "Real-Time Earthquake Detection and Hazard Assessment by ElarmS Across California", Geophysical Research Letters, vol. 36, L00B08, 2009, pp. 1-6.
Arens et al., "Demand Response Electrical Appliance Manager—User Interface Design, Development and Testing", Poster, Demand Response Enabling Technology Development, University of California Berkeley, Retrieved from dr.berkeley.edu/dream/posters/2005_6GUIposter.pdf, 2005, 1 page.
Arens et al., "Demand Response Enabled Thermostat—Control Strategies and Interface", Demand Response Enabling Technology Development Poster, University of California Berkeley, Retrieved from dr.berkeley.edu/dream/posters/2004_11CEC_TstatPoster.pdf, 2004, 1 page.
Arens et al., "Demand Response Enabling Technology Development", Phase I Report: Jun. 2003-Nov. 2005, Jul. 27, P:/DemandRes/UC Papers/DR-Phase1Report-Final DraftApril24-26.doc, University of California Berkeley, pp. 1-108.
Arens et al., "New Thermostat Demand Response Enabling Technology", Poster, University of California Berkeley, Jun. 10, 2004.
Auslander et al., "UC Berkeley DR Research Energy Management Group", Power Point Presentation, DR ETD Workshop, State of California Energy Commission, Jun. 11, 2007, pp. 1-35.
Bourke, "Server Load Balancing", O'Reilly & Associates, Inc., Aug. 2001, 182 pages.

(56) References Cited

OTHER PUBLICATIONS

Chatzigiannakis et al., "Priority Based Adaptive Coordination of Wireless Sensors and Actors", [online] Q2SWinet '06, Oct. 2, 2006 [Retrieved on Mar. 12, 2012]. Retrieved from the Internet: <URL: http://dl.acm.org/citation.cfm?id=1163681>.

Chen et al., "Demand Response-Enabled Residential Thermostat Controls", Abstract, ACEEE Summer Study on Energy Efficiency in Buildings, Mechanical Engineering Dept. and Architecture Dept., University of California Berkeley, 2008, pp. 1-24 through 1-36.

Deleeuw, "Ecobee WiFi Enabled Smart Thermostat Part 2: The Features Review", Retrieved from <URL: http://www.homenetworkenabled.com/content.php?136-ecobee-WiFi-enabled-Smart-Thermostat-Part-2-The-Features-review>, Dec. 2, 2011, 5 pages.

Gao et al., "The Self-Programming Thermostat: Optimizing Setback Schedules Based on Home Occupancy Patterns", In Proceedings of the First ACM Workshop on Embedded Sensing Systems for Energy-Efficiency in Buildings, Nov. 3, 2009, 6 pages.

Green, "Thermo Heat Tech Cool", Popular Mechanics Electronic Thermostat Guide, Oct. 1985, pp. 155-158.

Loisos et al., "Buildings End-Use Energy Efficiency: Alternatives to Compressor Cooling", California Energy Commission, Public Interest Energy Research, Jan. 2000, 80 pages.

Lu et al., "The Smart Thermostat: Using Occupancy Sensors to Save Energy in Homes", In Proceedings of the 8th ACM Conference on Embedded Networked Sensor Systems, Nov. 3-5, 2010, pp. 211-224.

Meier et al., "Thermostat Interface Usability: A Survey", Ernest Orlando Lawrence Berkeley National Laboratory, Environmental Energy Technologies Division, Berkeley California, Sep. 2010, pp. 1-73.

Mozer, "The Neural Network House: An Environmental that Adapts to It's Inhabitants", AAAI Technical Report SS-98-02, 1998, pp. 110-114.

International Patent Application No. PCT/US2012/058210, International Search Report & Written Opinion, Dec. 11, 2012, mailed 15 pages.

Peffer et al., "A Tale of Two Houses: The Human Dimension of Demand Response Enabling Technology from a Case Study of Adaptive Wireless Thermostat", Abstract, ACEEE Summer Study on Energy Efficiency in Buildings, Architecture Dept. and Mechanical Engineering Dept., University of California Berkeley, 2008, pp. 7-242 through 7-253.

Peffer et al., "Smart Comfort at Home: Design of a Residential Thermostat to Achieve Thermal Comfort, and Save Money and Peak Energy", University of California Berkeley, Mar. 2007, 1 page.

Ros et ai., "Multi-Sensor Human Tracking with the Bayesian Occupancy Filter", IEEE, 2009, 8 pages.

Salus, "S-Series Digital Thermostat Instruction Manual-ST620 Model No. Instruction Manual", www.salus-tech.com, Version 005, Apr. 29, 2010, 24 pages.

Sanford, "iPod (Click Wheel) (2004)", www.apple-history.com, Retrieved from: http://apple-history.com/ipod, Apr. 9, 2012, 2 pages.

White et al., "A Conceptual Model for Simulation Load Balancing", Proceedings 1998 Spring Simulation Interoperability Workshop, 1998, 7 pages.

Wong et al., "Maximum Likelihood Estimation of ARMA Model with Error Processes for Replicated Observations", National University of Singapore, Department of Economics, Working Paper No. 0217, 2002, 19 pages.

Wright et al., "DR ETD—Summary of New Thermostate, TempNode, & New Meter (UC Berkeley Project)", Power Point Presentation, Public Interest Energy Research, University of California Berkeley. Retrieved from: http://dr.berkeley.edu/dream/presentations/2005_6CEC.pdf, 2005, pp. 1-49.

Chinese Office Action issued Jan. 30, 2015 for Chinese Patent Application No. CN201280051997.2 filed on Sep. 30, 2012, all pages.

ADJUSTING PROXIMITY THRESHOLDS FOR ACTIVATING A DEVICE USER INTERFACE

CROSS-REFERENCES TO RELATED APPLICATIONS

This application claims the benefit of and is a continuation of U.S. patent application Ser. No. 13/632,112 filed Sep. 30, 2012, which is incorporated herein by reference in its entirety for all purposes. U.S. patent application Ser. No. 13/632,112 claims the benefit of U.S. Provisional Application No. 61/627,996 filed Oct. 21, 2011, which is incorporated herein by reference in its entirety for all purposes. U.S. patent application Ser. No. 13/632,112 is also a continuation-in-part of U.S. patent application Ser. No. 13/267,877, filed on Oct. 6, 2011, entitled "Strategic Reduction in Power Usage in Multi-Sensing, Wirelessly Communicating Learning Thermostat," which claims the benefit of U.S. Prov. Ser. No. 61/415,771 filed Nov. 19, 2010; and of U.S. Prov. Ser. No. 61/429,093 filed Dec. 31, 2010, each of which is incorporated by reference herein in their entirety for all purposes.

TECHNICAL FIELD

This patent specification relates to systems and methods for the monitoring and control of energy-consuming systems or other resource-consuming systems. More particularly, this patent specification relates to control units that govern the operation of energy-consuming systems, household devices, or other resource-consuming systems, including methods for activating electronic displays for thermostats that govern the operation of heating, ventilation, and air conditioning (HVAC) systems.

BACKGROUND OF THE INVENTION

Substantial effort and attention continue toward the development of newer and more sustainable energy supplies. The conservation of energy by increased energy efficiency remains crucial to the world's energy future. According to an October 2010 report from the U.S. Department of Energy, heating and cooling account for 56% of the energy use in a typical U.S. home, making it the largest energy expense for most homes. Along with improvements in the physical plant associated with home heating and cooling (e.g., improved insulation, higher efficiency furnaces), substantial increases in energy efficiency can be achieved by better control and regulation of home heating and cooling equipment.

As discussed in the technical publication No. 50-8433, entitled "Power Stealing Thermostats" from Honeywell (1997), early thermostats used a bimetallic strip to sense temperature and respond to temperature changes in the room. The movement of the bimetallic strip was used to directly open and close an electrical circuit. Power was delivered to an electromechanical actuator, usually relay or contactor in the HVAC equipment whenever the contact was closed to provide heating and/or cooling to the controlled space. Since these thermostats did not require electrical power to operate, the wiring connections were very simple. Only one wire connected to the transformer and another wire connected to the load. Typically, a 24 VAC power supply transformer, the thermostat, and 24 VAC HVAC equipment relay were all connected in a loop with each device having only two required external connections.

When electronics began to be used in thermostats, the fact that the thermostat was not directly wired to both sides of the transformer for its power source created a problem. This meant that the thermostat had to be hardwired directly from the system transformer. Direct hardwiring a common "C" wire from the transformer to the electronic thermostat may be very difficult and costly.

Because many households do not have a direct wire from the system transformer (such as a "C" wire), some thermostats have been designed to derive power from the transformer through the equipment load. The methods for powering an electronic thermostat from the transformer with a single direct wire connection to the transformer are called "power stealing" or "power sharing" methods. The thermostat "steals," "shares," or "harvests" its power during the "OFF" periods of the heating or cooling system by allowing a small amount of current to flow through it into the load coil below the load coil's response threshold (even at maximum transformer output voltage). During the "ON" periods of the heating or cooling system the thermostat draws power by allowing a small voltage drop across itself. Ideally, the voltage drop will not cause the load coil to dropout below its response threshold (even at minimum transformer output voltage). Examples of thermostats with power stealing capability include the Honeywell T8600, Honeywell T8400C, and the Emerson Model 1F97-0671. However, these systems do not have power storage means and therefore must always rely on power stealing.

Additionally, microprocessor controlled "intelligent" thermostats may have more advanced environmental control capabilities that can save energy while also keeping occupants comfortable. To do this, these thermostats require more information from the occupants as well as the environments where the thermostats are located. These thermostats may also be capable of connection to computer networks, including both local area networks (or other "private" networks) and wide area networks such as the Internet (or other "public" networks), in order to obtain current and forecasted outside weather data, cooperate in so-called demand-response programs (e.g., automatic conformance with power alerts that may be issued by utility companies during periods of extreme weather), enable users to have remote access and/or control thereof through their network-connected device (e.g., smartphone, tablet computer, PC-based web browser), and other advanced functionalities that may require network connectivity.

Issues arise in relation to providing microprocessor-controlled thermostats using high-powered user interfaces, one or more such issues being at least partially resolved by one or more of the embodiments described herein below. On the one hand, it is desirable to provide a thermostat having advanced functionalities such as those associated with relatively powerful microprocessors and reliable wireless communications chips, while also providing a thermostat that has an attractive, visually pleasing electronic display that users will find appealing to view and interact with. On the other hand, it is desirable to provide a thermostat that is compatible and adaptable for installation in a wide variety of homes, including a substantial percentage of homes that are not equipped with the "C" wire discussed above. It is still further desirable to provide such a thermostat that accommodates easy do-it-yourself installation such that the expense and inconvenience of arranging for an HVAC technician to visit the premises to install the thermostat can be avoided for a large number of users. It is still further desirable to provide a thermostat having such processing power, wireless communications capabilities, visually pleasing display qualities, and other advanced functionalities, while also being a thermostat that, in addition to not requiring a "C" wire, likewise does not need to be plugged into a household line current or a so-called "power brick," which can be inconvenient for the particular location of the thermostat as well as unsightly. Therefore, improvements are needed in the art.

BRIEF SUMMARY OF THE INVENTION

In one embodiment, smart-home device may be presented. The device may include a user interface including an electronic display having a first display mode and a second display mode, the first display mode generally requiring more power than said second display mode. The device may further include a processing system coupled to the user interface, the processing system being configured to be in operative communication with one or more environmental sensors for determining at least one environmental condition, and in operative communication with one or more input devices including the user interface. The device may also include at least one sensor configured to detect a physical closeness of a user to the at least one sensor, the at least one sensor being in operative communication with the processing system, the processing system being configured to cause the electronic display to be in the first display mode when a closeness threshold has been exceeded. The processing system is further configured to automatically adjust the closeness threshold based at least in part on a historical plurality of physical closeness events as detected by the at least one sensor.

In another embodiment, A method for optimizing the operation of a user interface of a smart-home device is presented. The method may include determining automatically, by a processing system, a closeness threshold based at least in part on a historical plurality of physical closeness events as detected by at least one sensor. The at least one sensor may be configured to detect a physical closeness of a user to the at least one sensor, the at least one sensor being in operative communication with the processing system. The method may also include detecting a physical closeness of a user to the at least one sensor and determining, by the processing system, that the closeness threshold has been exceeded, the processing system being configured to be in operative communication with one or more environmental sensors for determining at least one environmental condition, and in operative communication with one or more input devices including said user interface. The method may additionally include causing, by the processing system, an electronic display to be in a first display mode when the closeness threshold has been exceeded, the user interface including the electronic display having the first display mode and a second display mode, the first display mode generally requiring more power than said second display mode.

In yet another embodiment, a smart-home device may be presented. The device may include a user interface that is configured to operate in at least two different modes including a first mode and a second mode, where the user interface requires more power when operating in the first mode than in the second mode. The device may also include a plurality of sensors, including at least one sensor configured to detect a presence of a user within a proximity of the smart-home device. The device may additionally include a first processing function that is configured to determine a proximity profile and to cause the user interface to be in the first mode when one or more of the plurality of sensors provides one or more responses to the first processing function that matches the proximity profile, where the proximity profile may be determined using at least a history of responses from the plurality of sensors that are likely to coincide with times where one or more users intend to view the user interface.

A further understanding of the nature and advantages of the present invention may be realized by reference to the remaining portions of the specification and the drawings. Also note that other embodiments may be described in the following disclosure and claims.

DETAILED DESCRIPTION OF THE INVENTION

Figure 1:
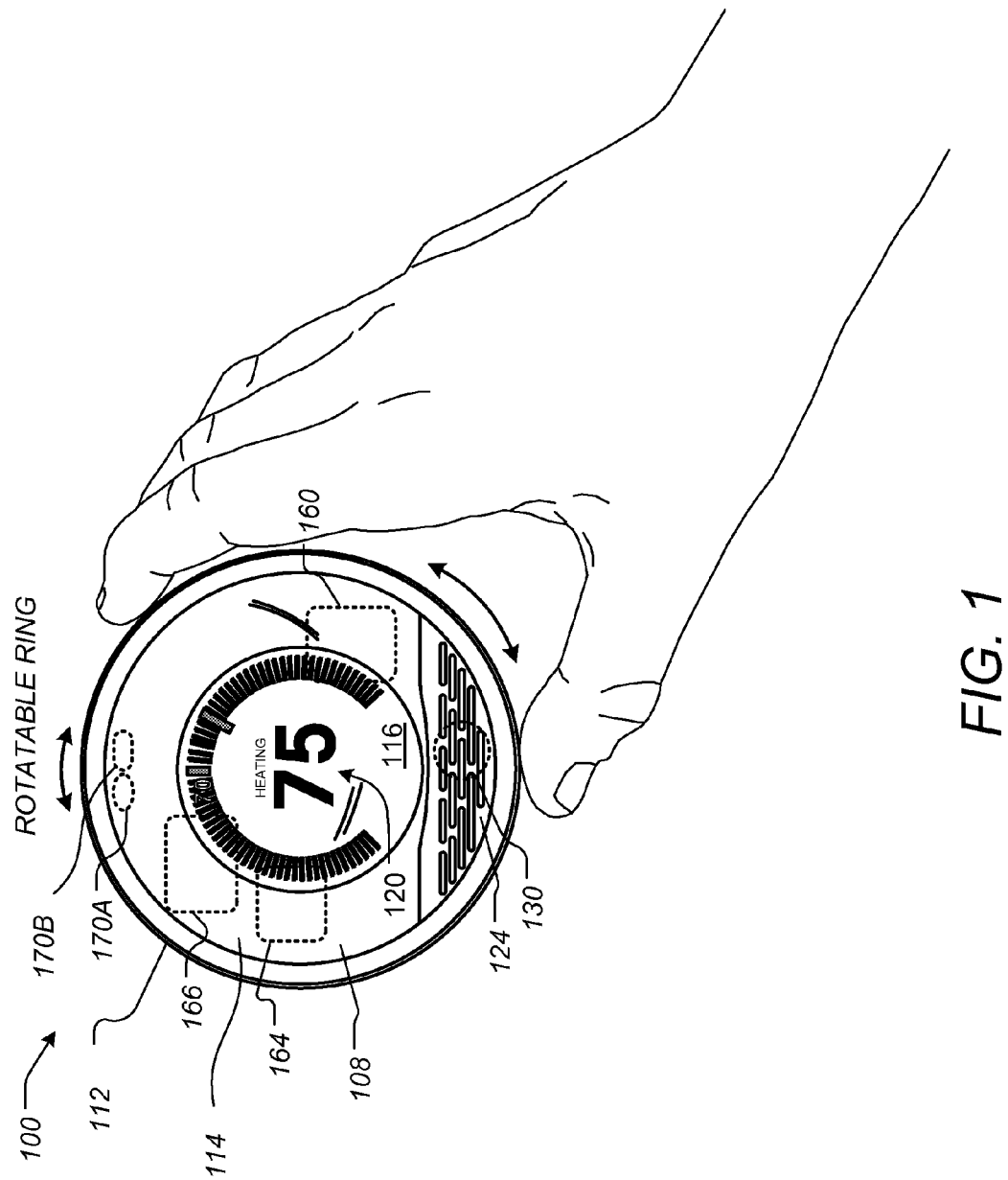
FIG. 1 illustrates a perspective view of a thermostat, according to one embodiment.

The subject matter of this patent specification relates to the subject matter of the following commonly assigned applications, each of which is incorporated by reference herein: International Application No. PCT/US12/00007 filed Jan. 3, 2012; and U.S. Ser. No. 13/467,025 filed May 8, 2012. The above-referenced patent applications are collectively referenced herein as "the commonly-assigned incorporated applications."

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

It is to be appreciated that while one or more embodiments are described further herein in the context of typical HVAC system used in a residential home, such as single-family residential home, the scope of the present teachings is not so limited. More generally, thermostats according to one or more of the preferred embodiments are applicable for a wide variety of enclosures having one or more HVAC systems including, without limitation, duplexes, townhomes, multi-unit apartment buildings, hotels, retail stores, office buildings, and industrial buildings. Further, it is to be appreciated that while the terms user, customer, installer, homeowner, occupant, guest, tenant, landlord, repair person, and/or the like may be used to refer to the person or persons who are interacting with the thermostat or other device or user interface in the context of one or more scenarios described herein, these references are by no means to be considered as limiting the scope of the present teachings with respect to the person or persons who are performing such actions.

Exemplary Thermostat Embodiments

Provided according to one or more embodiments are systems, methods, and computer program products for controlling one or more HVAC systems based on one or more versatile sensing and control units (VSCU units), each VSCU unit being configured and adapted to provide sophisticated, customized, energy-saving HVAC control functionality while at the same time being visually appealing, non-intimidating, and easy to use. The term "thermostat" is used herein below to represent a particular type of VSCU unit (Versatile Sensing and Control) that is particularly applicable for HVAC control in an enclosure. Although "thermostat" and "VSCU unit" may be seen as generally interchangeable for the contexts of HVAC control of an enclosure, it is within the scope of the present teachings for each of the embodiments herein to be applied to VSCU units having control functionality over measurable characteristics other than temperature (e.g., pressure, flow rate, height, position, velocity, acceleration, capacity, power, loudness, brightness) for any of a variety of different control systems involving the governance of one or more measurable characteristics of one or more physical systems, and/or the governance of other energy or resource consuming systems such as water usage systems, air usage systems, systems involving the usage of other natural resources, and systems involving the usage of various other forms of energy.

FIGS. 1-5 and the descriptions in relation thereto provide exemplary embodiments of thermostat hardware and/or software that can be used to implement the specific embodiments of the appended claims. This thermostat hardware and/or software is not meant to be limiting, and is presented to provide an enabling disclosure. FIG. 1 illustrates a perspective view of a thermostat 100, according to one embodiment. In this specific embodiment, the thermostat 100 can be controlled by at least two types of user input, the first being a rotation of the outer ring 112, and the second being an inward push on an outer cap 108 until an audible and/or tactile "click" occurs. As used herein, these two types of user inputs, may be referred to as "manipulating" the thermostat. In other embodiments, manipulating the thermostat may also include pressing keys on a keypad, voice recognition commands, and/or any other type of input that can be used to change or adjust settings on the thermostat 100.

For this embodiment, the outer cap 108 can comprise an assembly that includes the outer ring 112, a cover 114, an electronic display 116, and a metallic portion 124. Each of these elements, or the combination of these elements, may be referred to as a "housing" for the thermostat 100. Simultaneously, each of these elements, or the combination of these elements, may also form a user interface. The user interface may specifically include the electronic display 116. In FIG. 1, the user interface 116 may be said to operate in an active display mode. The active display mode may include providing a backlight for the electronic display 116. In other embodiments, the active display mode may increase the intensity and/or light output of the electronic display 116 such that a user can easily see displayed settings of the thermostat 100, such as a current temperature, a setpoint temperature, an HVAC function, and/or the like. The active display mode may be contrasted with an inactive display mode (not shown). The inactive display mode can disable a backlight, reduce the amount of information displayed, lessen the intensity of the display, and/or altogether turn off the electronic display 116, depending on the embodiment.

Depending on the settings of the thermostat 100, the active display mode and the inactive display mode of the electronic display 116 may also or instead be characterized by the relative power usage of each mode. In one embodiment, the active display mode may generally require substantially more electrical power than the inactive display mode. In some embodiments, different operating modes of the electronic display 116 may instead be characterized completely by their power usage. In these embodiments, the different operating modes of the electronic display 116 may be referred to as a first mode and a second mode, where the user interface requires more power when operating in the first mode than when operating in the second mode.

According to some embodiments the electronic display 116 may comprise a dot-matrix layout (individually addressable) such that arbitrary shapes can be generated, rather than being a segmented layout. According to some embodiments, a combination of dot-matrix layout and segmented layout is employed. According to some embodiments, electronic display 116 may be a backlit color liquid crystal display (LCD). An example of information displayed on the electronic display 116 is illustrated in FIG. 1, and includes central numerals 120 that are representative of a current setpoint temperature. According to some embodiments, metallic portion 124 can have a number of slot-like openings so as to facilitate the use of a sensors 130, such as a passive infrared motion sensor (PIR), mounted beneath the slot-like openings.

According to some embodiments, the thermostat 100 can include additional components, such as a processing system 160, display driver 164, and a wireless communications system 166. The processing system 160 can adapted or configured to cause the display driver 164 to cause the electronic display 116 to display information to the user. The processing system 160 can also be configured to receive user input via the rotatable ring 112. These additional components, including the processing system 160, can be enclosed within the housing, as displayed in FIG. 1. These additional components are described in further detail herein below.

The processing system 160, according to some embodiments, is capable of carrying out the governance of the thermostat's operation. For example, processing system 160 can be further programmed and/or configured to maintain and update a thermodynamic model for the enclosure in which the HVAC system is installed. According to some embodiments, the wireless communications system 166 can be used to communicate with devices such as personal computers, remote servers, handheld devices, smart phones, and/or other thermostats or HVAC system components. These communications can be peer-to-peer communications, communications through one or more servers located on a private network, or and/or communications through a cloud-based service.

Motion sensing as well as other techniques can be use used in the detection and/or prediction of occupancy, as is described further in the commonly assigned U.S. Ser. No. 12/881,430, supra. According to some embodiments, occupancy information can be a used in generating an effective and efficient scheduled program. For example, an active proximity sensor 170A can be provided to detect an approaching user by infrared light reflection, and an ambient light sensor 170B can be provided to sense visible light. The proximity sensor 170A can be used in conjunction with a plurality of other sensors to detect proximity in the range of about one meter so that the thermostat 100 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place or about to take place. The various types of sensors that may be used, as well as the operation of the "wake up" function are described in much greater detail throughout the remainder of this disclosure.

Figure 2:
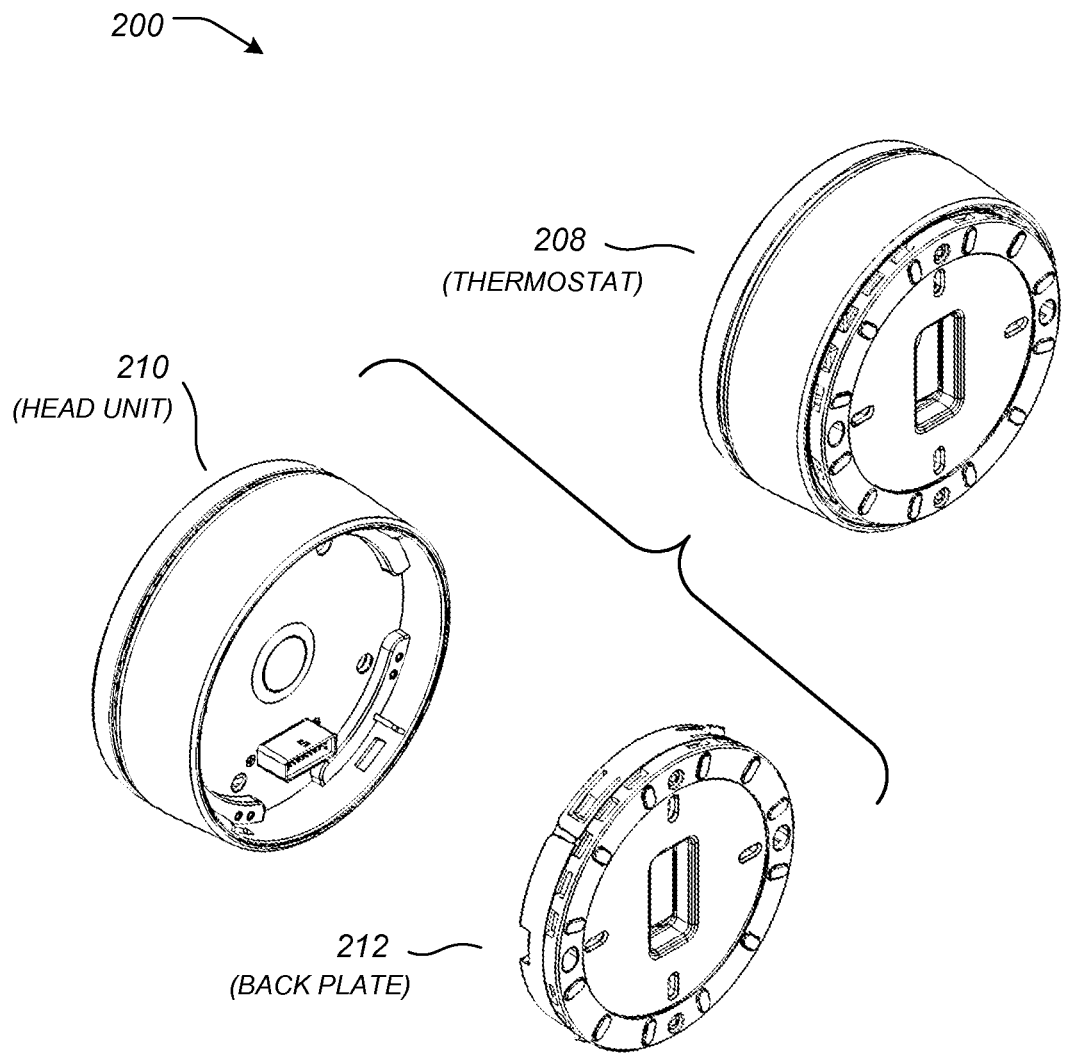
FIG. 2 illustrates an exploded perspective view of a thermostat having a head unit and the backplate, according to one embodiment.

In some embodiments, the thermostat can be physically and/or functionally divided into at least two different units. Throughout this disclosure, these two units can be referred to as a head unit and a backplate. FIG. 2 illustrates an exploded perspective view 200 of a thermostat 208 having a head unit 210 and a backplate 212, according to one embodiment. Physically, this arrangement may be advantageous during an installation process. In this embodiment, the backplate 212 can first be attached to a wall, and the HVAC wires can be attached to a plurality of HVAC connectors on the backplate 212. Next, the head unit 210 can be connected to the backplate 212 in order to complete the installation of the thermostat 208.

Figure 3A:
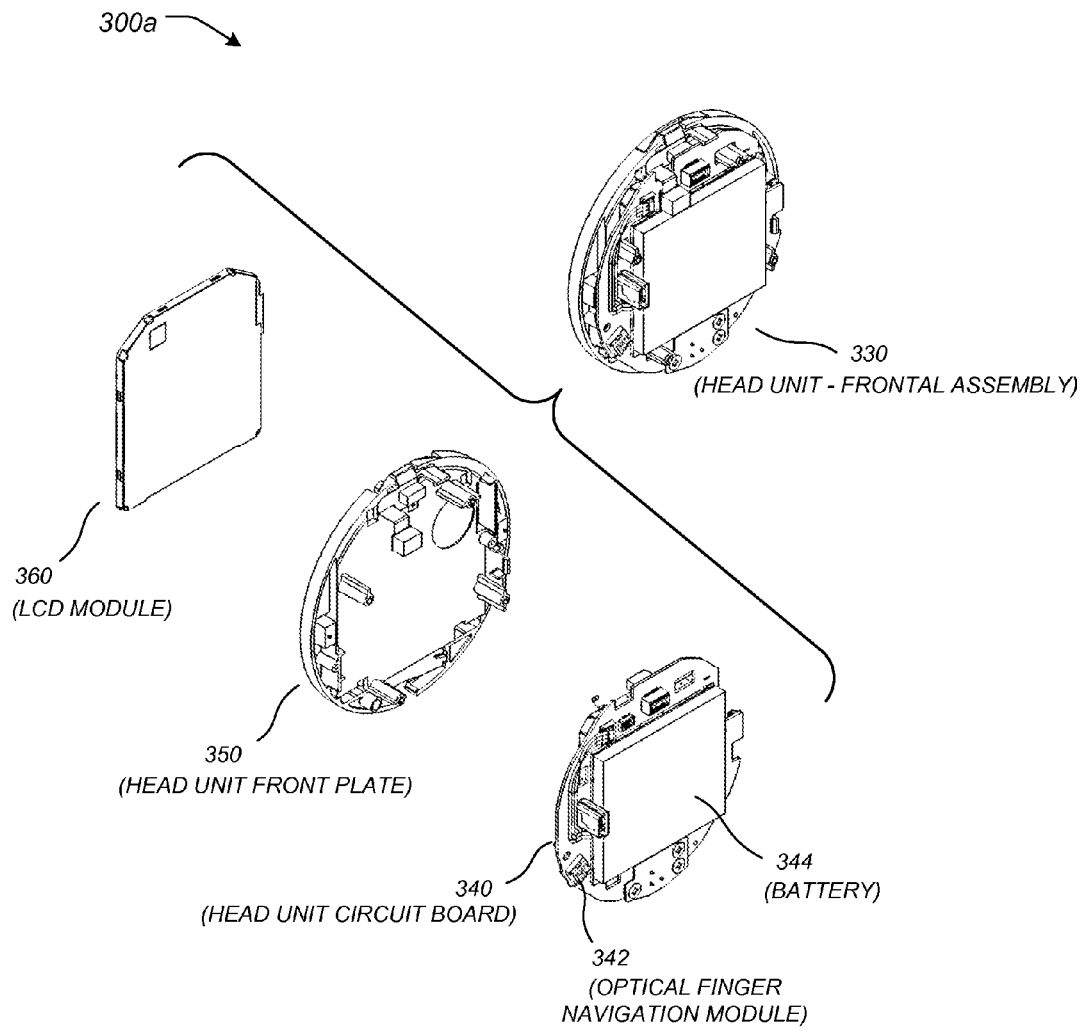
FIG. 3A illustrates an exploded perspective view of a head unit with respect to its primary components, according to one embodiment.

FIG. 3A illustrates an exploded perspective view 300a of a head unit 330 with respect to its primary components, according to one embodiment. Here, the head unit 330 may include an electronic display 360. According to this embodiment, the electronic display 360 may comprise an LCD module. Furthermore, the head unit 330 may include a mounting assembly 350 used to secure the primary components in a completely assembled head unit 330. The head unit 330 may further include a circuit board 340 that can be used to integrate various electronic components described further below. In this particular embodiment, the circuit board 340 of the head unit 330 can include a manipulation sensor 342 to detect user manipulations of the thermostat. In embodiments using a rotatable ring, the manipulation sensor 342 may comprise an optical finger navigation module as illustrated in FIG. 3A. A rechargeable battery 344 may also be included in the assembly of the head unit 330. In one preferred embodiment, rechargeable battery 344 can be a Lithium-Ion battery, which may have a nominal voltage of 3.7 volts and a nominal capacity of 560 mAh.

Figure 3B:
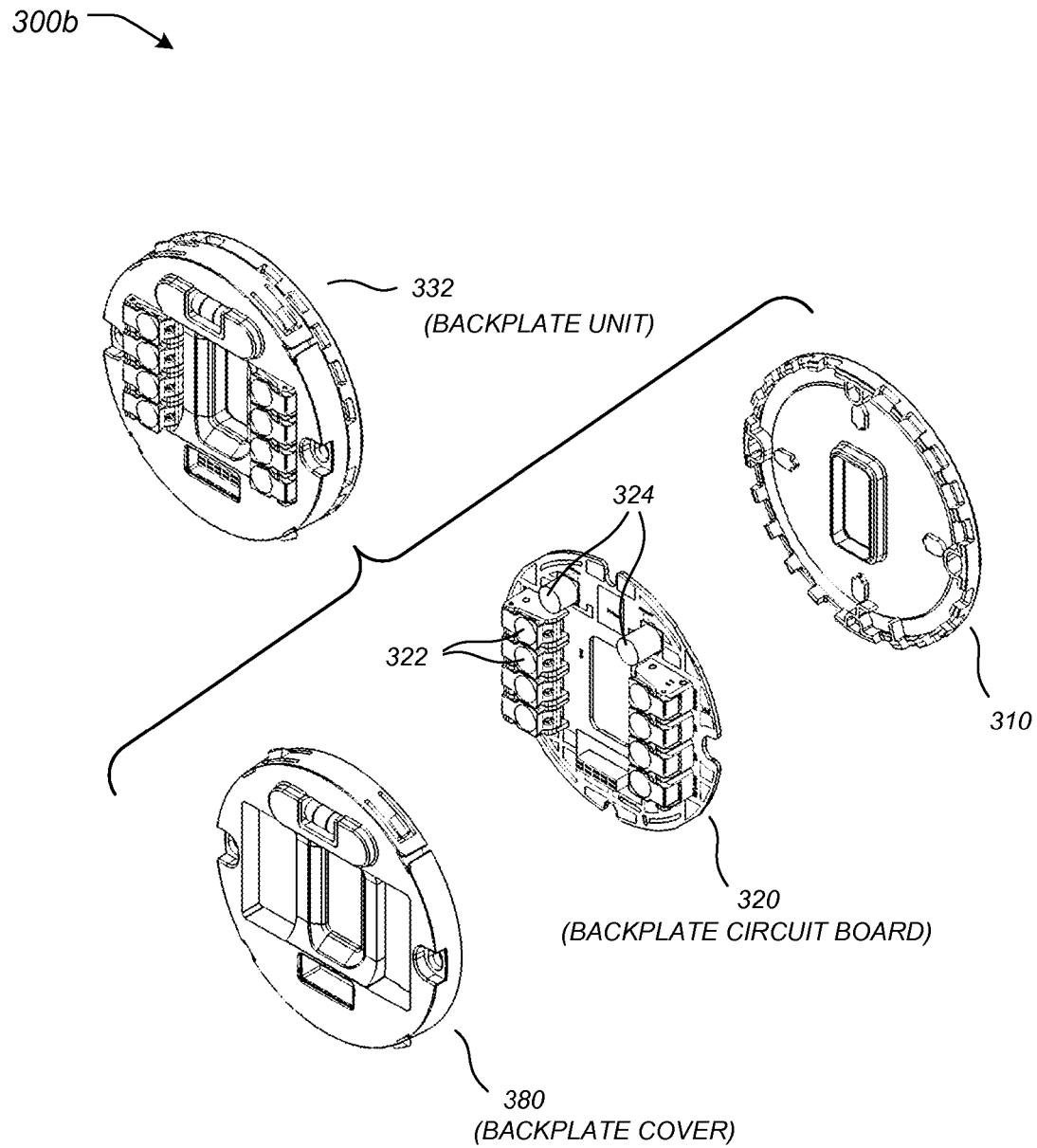
FIG. 3B illustrates an exploded perspective view of a backplate with respect to its primary components, according to one embodiment.

FIG. 3B illustrates an exploded perspective view 300b of a backplate 332 with respect to its primary components, according to one embodiment. The backplate 332 may include a frame 310 that can be used to mount, protect, or house a backplate circuit board 320. The backplate circuit board 320 may be used to mount electronic components, including one or more processing functions, and/or one or more HVAC wire connectors 322. The one or more HVAC wire connectors 322 may include integrated wire insertion sensing circuitry configured to determine whether or not a wire is mechanically and/or electrically connected to each of the one or more HVAC wire connectors 322. In this particular embodiment, two relatively large capacitors 324 are a part of power stealing circuitry that can be mounted to the backplate circuit board 320. The power stealing circuitry is discussed further herein below.

Figure 4A:
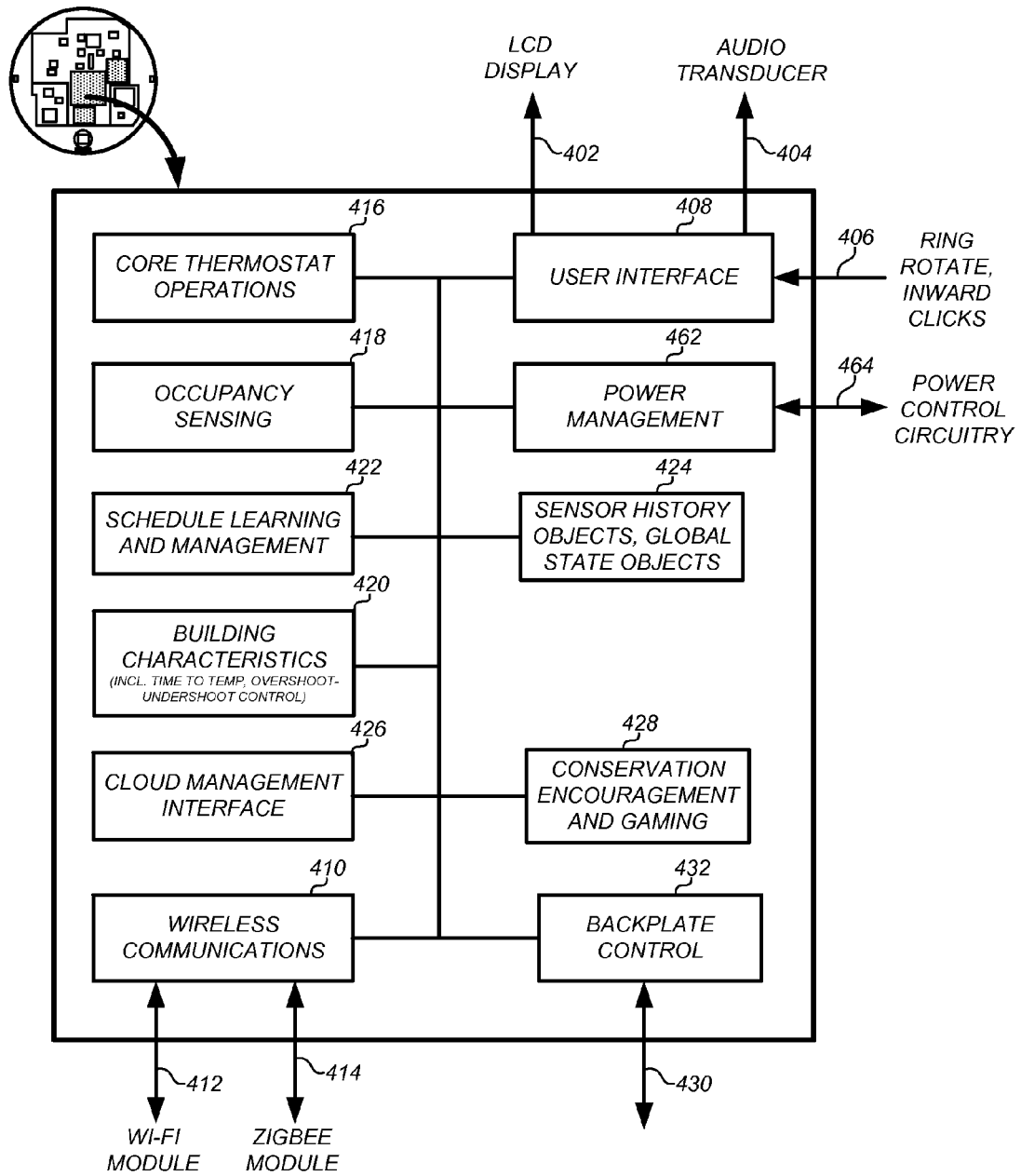
FIG. 4A illustrates a simplified functional block diagram for a head unit, according to one embodiment.

In addition to physical divisions within the thermostat that simplify installation process, the thermostat may also be divided functionally between the head unit and the backplate. FIG. 4A illustrates a simplified functional block diagram 400a for a head unit, according to one embodiment. The functions embodied by block diagram 400a are largely self-explanatory, and may be implemented using one or more processing functions. As used herein, the term "processing function" may refer to any combination of hardware and/or software. For example, a processing function may include a microprocessor, a microcontroller, distributed processors, a lookup table, digital logic, logical/arithmetic functions implemented in analog circuitry, and/or the like. A processing function may also be referred to as a processing system, a processing circuit, or simply a circuit.

In this embodiment, a processing function on the head unit may be implemented by an ARM processor. The head unit processing function may interface with the electronic display 402, an audio system 404, and a manipulation sensor 406 as a part of a user interface 408. The head unit processing function may also facilitate wireless communications 410 by interfacing with various wireless modules, such as a Wi-Fi module 412 and/or a ZigBee module 414. Furthermore, the head unit processing function may be configured to control the core thermostat operations 416, such as operating the HVAC system. The head unit processing function may further be configured to determine or sense occupancy 418 of a physical location, and to determine building characteristics 420 that can be used to determine time-to-temperature characteristics. Using the occupancy sensing 418, the processing function on the head unit may also be configured to learn and manage operational schedules 422, such as diurnal heat and cooling schedules. A power management module 462 may be used to interface with a corresponding power management module on the back plate, the rechargeable battery, and a power control circuit 464 on the back plate.

Additionally, the head unit processing function may include and/or be communicatively coupled to one or more memories. The one or more memories may include one or more sets of instructions that cause the processing function to operate as described above. The one or more memories may also include a sensor history and global state objects 424. The one or more memories may be integrated with the processing function, such as a flash memory or RAM memory available on many commercial microprocessors. The head unit processing function may also be configured to interface with a cloud management system 426, and may also operate to conserve energy wherever appropriate 428. An interface 432 to a backplate processing function 430 may also be included, and may be implemented using a hardware connector.

Figure 4B:
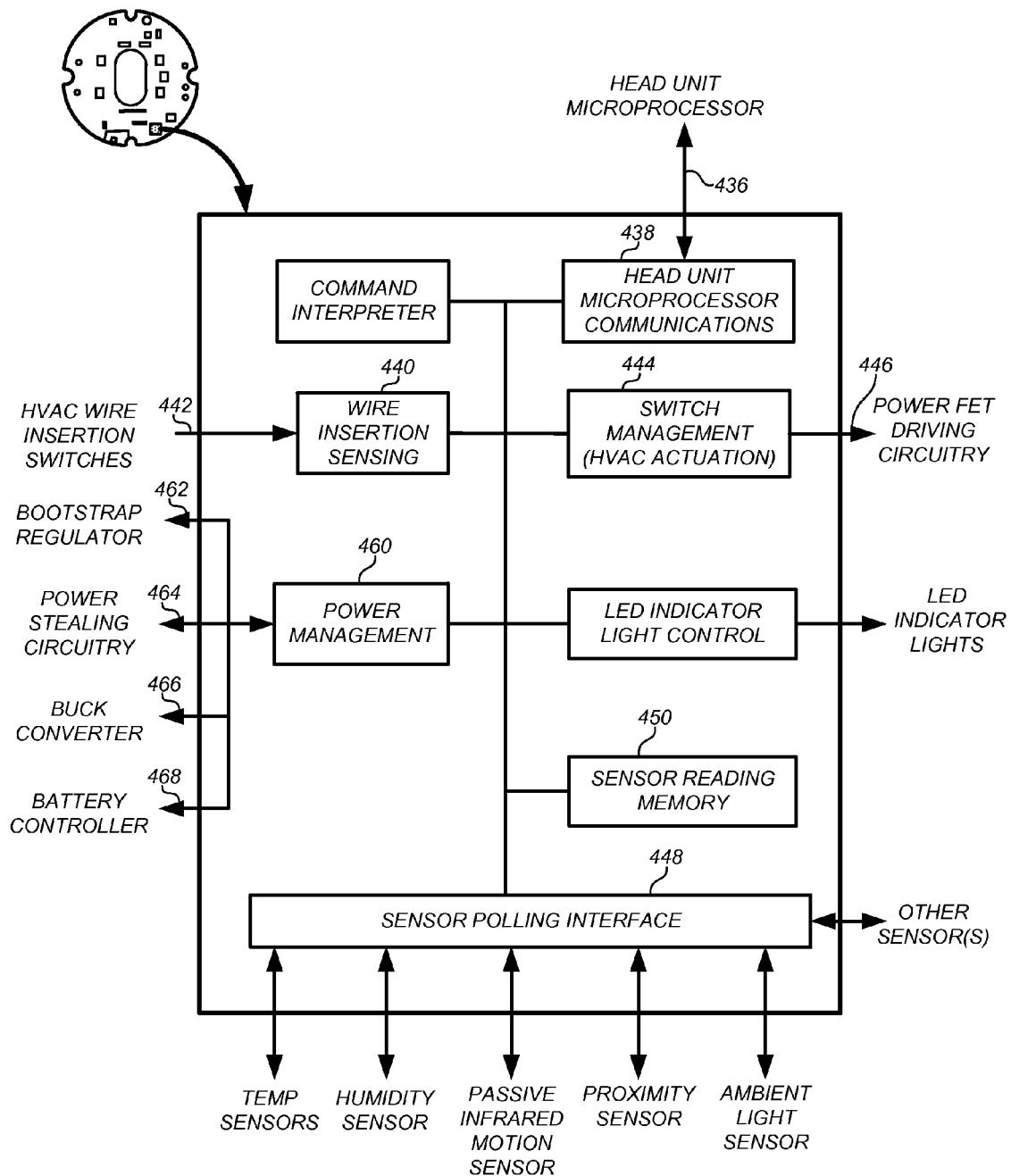
FIG. 4B illustrates a simplified functional block diagram for a backplate, according to one embodiment.

FIG. 4B illustrates a simplified functional block diagram for a backplate, according to one embodiment. Using an interface 436 that is matched to the interface 432 shown in FIG. 4A, the backplate processing function can communicate with the head unit processing function 438. The backplate processing function can include wire insertion sensing 440 that is coupled to external circuitry 442 configured to provide signals based on different wire connection states. The backplate processing function may be configured to manage the HVAC switch actuation 444 by driving power FET circuitry 446 to control the HVAC system.

The backplate processing function may also include a sensor polling interface 448 to interface with a plurality of sensors. In this particular embodiment, the plurality of sensors may include a temperature sensor, a humidity sensor, a PIR sensor, a proximity sensor, an ambient light sensor, and or other sensors not specifically listed. This list is not meant to be exhaustive. Other types of sensors may be used depending on the particular embodiment and application, such as sound sensors, flame sensors, smoke detectors, and/or the like. The sensor polling interface 448 may be communicatively coupled to a sensor reading memory 450. The sensor reading memory 450 can store sensor readings and may be located internally or externally to a microcontroller or microprocessor.

Finally, the backplate processing function can include a power management unit 460 that is used to control various digital and/or analog components integrated with the backplate and used to manage the power system of the thermostat. Although one having skill in the art will recognize many different implementations of a power management system, the power management system of this particular embodiment can include a bootstrap regulator 462, a power stealing circuit 464, a buck converter 466, and/or a battery controller 468.

Figure 5:
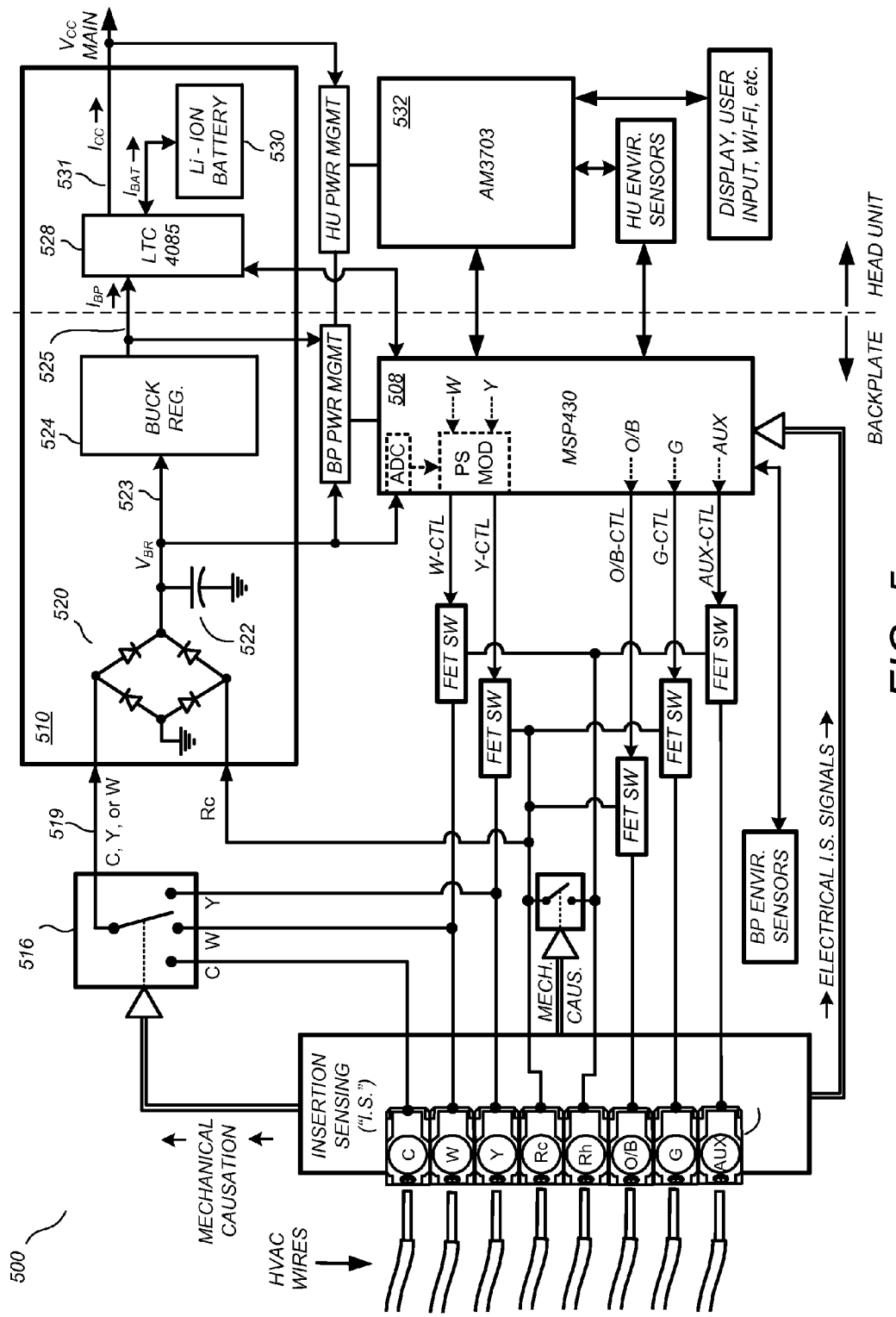
FIG. 5 illustrates a simplified circuit diagram of a system for managing the power consumed by a thermostat, according to one embodiment.

FIG. 5 illustrates a simplified circuit diagram 500 of a system for managing the power consumed by a thermostat, according to one embodiment. The powering circuitry 510 comprises a full-wave bridge rectifier 520, a storage and waveform-smoothing bridge output capacitor 522 (which can be, for example, on the order of 30 microfarads), a buck regulator circuit 524, a power-and-battery (PAB) regulation circuit 528, and a rechargeable lithium-ion battery 530. In conjunction with other control circuitry including backplate power management circuitry 527, head unit power management circuitry 529, and the microcontroller 508, the powering circuitry 510 can be configured and adapted to have the characteristics and functionality described herein below. Description of further details of the powering circuitry 510 and associated components can be found elsewhere in the instant disclosure and/or in the commonly assigned U.S. Ser. No. 13/034,678, supra, and U.S. Ser. No. 13/267,871, supra.

By virtue of the configuration illustrated in FIG. 5, when there is a "C" wire presented upon installation, the powering circuitry 510 operates as a relatively high-powered, rechargeable-battery-assisted AC-to-DC converting power supply. When there is not a "C" wire presented, the powering circuitry 510 operates as a power-stealing, rechargeable-battery-assisted AC-to-DC converting power supply. The powering circuitry 510 generally serves to provide the voltage Vcc MAIN that is used by the various electrical components of the thermostat, which in one embodiment can be about 4.0 volts. For the case in which the "C" wire is present, there is no need to worry about accidentally tripping (as there is in inactive power stealing) or untripping (for active power stealing) an HVAC call relay, and therefore relatively large amounts of power can be assumed to be available. Generally, the power supplied by the "C" wire will be greater than the instantaneous power required at any time by the remaining circuits in the thermostat.

However, a "C" wire will typically only be present in about 20% of homes. Therefore, the powering circuitry 510 may also be configured to "steal" power from one of the other HVAC wires in the absence of a "C" wire. As used herein, "inactive power stealing" refers to the power stealing that is performed during periods in which there is no active call in place based on the lead from which power is being stolen. Thus, for cases where it is the "Y" lead from which power is stolen, "inactive power stealing" refers to the power stealing that is performed when there is no active cooling call in place. As used herein, "active power stealing" refers to the power stealing that is performed during periods in which there is an active call in place based on the lead from which power is being stolen. Thus, for cases where it is the "Y" lead from which power is stolen, "active power stealing" refers to the power stealing that is performed when there is an active cooling call in place. During inactive or active power stealing, power can be stolen from a selected one of the available call relay wires. While a complete description of the power stealing circuitry 510 can be found in the commonly assigned applications that have been previously incorporated herein by reference, the following brief explanation is sufficient for purposes of this disclosure.

Some components in the thermostat, such as the head unit processing function, the user interface, and/or the electronic display may consume more instantaneous power than can be provided by power stealing alone. When these more power-hungry components are actively operating, the power supplied by power stealing can be supplemented with the rechargeable battery 530. In other words, when the thermostat is engaged in operations, such as when the electronic display is in an active display mode, power may be supplied by both power stealing and the rechargeable battery 530. In order to preserve the power stored in the rechargeable battery 530, and to give the rechargeable battery 530 an opportunity to recharge, some embodiments optimize the amount of time that the head unit processing function and the electronic display are operating in an active mode. In other words, it may be advantageous in some embodiments to keep the head unit processing function in a sleep mode or low power mode and to keep the electronic display in an inactive display mode as long as possible without affecting the user experience.

When the head unit processing function and the electronic display are in an inactive or sleep mode, the power consumed by the thermostat is generally less than the power provided by power stealing. Therefore, the power that is not consumed by the thermostat can be used to recharge the rechargeable battery 530. In this embodiment, the backplate processing function 508 (MSP430) can be configured to monitor the environmental sensors in a low-power mode, and then wake the head unit processing function 532 (AM3703) when needed to control the HVAC system, etc. Similarly, the backplate processing function 508 can be used to monitor sensors used to detect the closeness of a user, and wake the head unit processing system 532 and/or the electronic display when it is determined that a user intends to interface with the thermostat.

It will be understood by one having skill in the art that the various thermostat embodiments depicted and described in relation to FIGS. 1-5 are merely exemplary and not meant to be limiting. Many other hardware and/or software configurations may be used to implement a thermostat and the various functions described herein below. These embodiments should be seen as an exemplary platform in which the following embodiments can be implemented to provide an enabling disclosure. Of course, the following methods, systems, and/or software program products could also be implemented using different types of thermostats, different hardware, and/or different software.

Thermostat Proximity Thresholds

In thermostats that require power management systems, such as the embodiments described above, it may be desirable to intelligently control the times when an electronic display on a user interface operates in an active display mode. Even in thermostats that have a "C" wire available or are otherwise provided with sufficient external power, it may be still be desirable to intelligently control the electronic display. Users may prefer a thermostat that "activates" when they approach, thus presenting a user interface that seems responsive to a user even before a manipulation event.

In power-conscious systems, advanced electronic displays may be used to give the thermostat a modern and advanced look and feel. Such advanced electronic displays may include backlighting, LCD displays, color displays, graphic and/or raster display capabilities, rapid frame or refresh rates, and/or the like. These features may cause the electronic display to use a substantial amount of power. Additionally, these features may require a microcontroller or microprocessor to be interfaced with the electronic display. Significant processing operations may be required to display graphics, menus, animations, and/or color changes that signify temperature changes. Prior to this disclosure, such advanced electronic displays required external power or a "C" wire connection to the thermostat. Therefore, homes or locations where external power and/or "C" wires were not available were unable to use advanced thermostats without requiring significant electrical upgrades to the home or location. They were instead limited to thermostats with electronic displays that could operate solely on power provided by the call relay wires of the HVAC system.

However, in the thermostat embodiments described herein, advanced electronic displays may be used in conjunction with a rechargeable battery. As previously described, power can be "stolen" from a selected call relay wire, either actively or inactively, and can be used to charge a rechargeable battery and power the thermostat. Many advanced electronic displays, and the microprocessors required to control them, may together require more power than can be instantaneously provided by power stealing. In other words, powering an advanced electronic display and a microprocessor together using power stealing exclusively would likely cause the call relay in the HVAC system to trip, or to interpret the power stealing as an HVAC function call, resulting in inadvertent heating, cooling, fan activation, and/or the like.

Therefore, in power stealing systems, the electronic display should operate in an inactive display mode during times when it can be reliably inferred that a user is not approaching the thermostat in order to interact with thermostat or otherwise view the electronic display. During the inactive display mode, power stealing can supply more power than is needed to operate the thermostat, and the excess power can be used to charge the rechargeable battery. During times when it can be reliably inferred that a user is approaching the thermostat in order to interact with the thermostat or view the electronic display, the electronic display can operate in an active display mode. Although power stealing cannot reliably provide enough average power to operate the electronic display while in an active display mode, the rechargeable battery can provide additional power such that the HVAC system is not tripped.

Using a rechargeable battery enables the use of an advanced electronic display in power stealing systems, but only for limited times. It should be clear that if the electronic display continuously operates in an active display mode, the rechargeable battery would eventually lose its charge and no longer be able to supply sufficient power. Without the rechargeable battery, power stealing could not supply enough power without tripping the HVAC system. Therefore, methods and systems described herein provide technologies that can be used to intelligently control when an electronic display on a user interface should operate in an inactive display mode and an active display mode.

Again, these methods and systems for intelligently controlling the electronic display are not limited to power stealing systems. Environmental control devices having plenty of power available may also benefit from these embodiments. For example, users may prefer an electronic display that activates in a welcoming fashion as they approach. It may be useful turn off the electronic display in an unoccupied room to prevent excess light from being generated and affecting a darker ambience. Generally, it may also be useful to save power, no matter how it is provided, in accordance with environmental and sustainability concerns.

In one embodiment, the thermostat may include a processing system disposed within the housing and communicatively coupled to the user interface. The processing system may include one or more processing functions, as defined above. The processing system may also be configured to communicate with one or more sensors. The one or more sensors may be used to determine ambient air temperature and other environmental conditions. At least one of the sensors may be configured to detect a physical closeness of a user to the user interface of the thermostat. One or more of the sensors can be in operative communication with the processing system, and can be used to determine when a closeness threshold has been exceeded or when a proximity profile is matched by an approaching user. In response, the processing system can cause the user interface to be in an active display mode.

Figure 6:
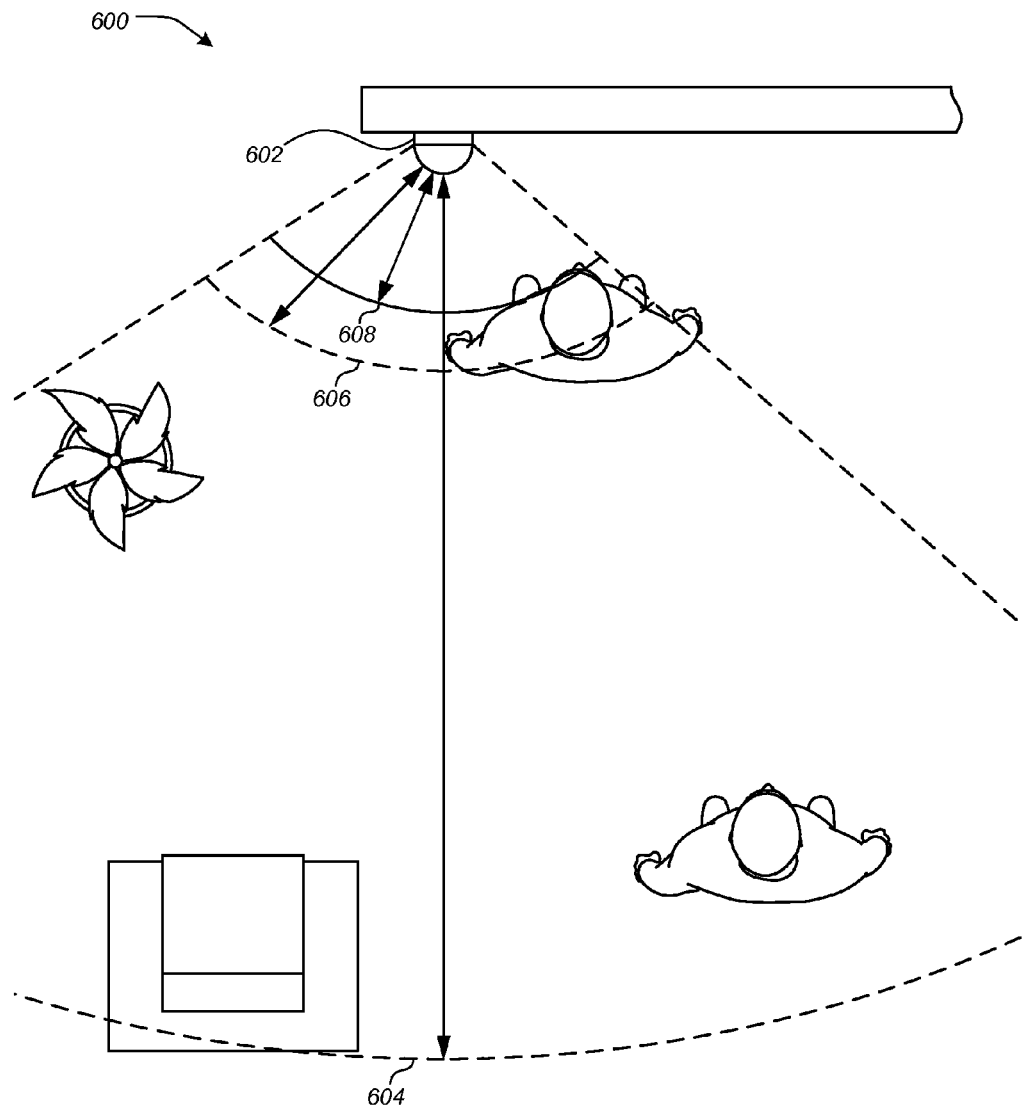
FIG. 6 illustrates an overhead view of an area monitored by a thermostat, according to one embodiment.

FIG. 6 illustrates an overhead view 600 of an area monitored by a thermostat 602, according to one embodiment. The area monitored by the thermostat 602 may comprise a room within a building, a hallway, an open living area, and/or the like. The temperature sensors of thermostat 602 may be configured to detect the ambient temperature of the area being monitored. As illustrated by FIG. 6, various sensors of the thermostat 602 may have different responsive areas. For example, one of the plurality of sensors may include a responsive area 604 denoted by the set of dashed lines. Similarly, another of the plurality of sensors may include a responsive area 606 denoted by the second set of dashed lines. As used herein, the term "responsive area" may include an area in which a phenomenon that a sensor is configured to detect will generate a response by the sensor. For example, a motion detector associated with responsive area 604 could detect motion within the responsive area 604 of an object meeting the specifications of the motion detector.

Merely generating a response from a sensor may not be sufficient to infer that a user is approaching the thermostat to view the electronic display. The actual response generated by a sensor when an event occurs within its associated responsive area will in many cases be dependent on the intensity of the event or the distance of the event to the thermostat. For example, if an event occurs along the periphery of the associated responsive area, the response of the sensor may be small. However, if an event occurs closer to the thermostat, the response of the sensor may be larger. Therefore, it is possible to determine a threshold for a sensor response in order to activate the electronic display.

For example, a sensor associated with responsive area 606 may be used to set a threshold to activate the electronic display. Generally, a threshold can correspond to a voltage/current output, a digital readout, the frequency, or other similar electrical output of a sensor. The threshold may correspond to a certain distance, such as distance 608 for an event having a known intensity. For example, a user approaching the thermostat 602 with a PIR sensor associated with responsive area 606 could trip a threshold when coming within distance 608 of the thermostat 602. Larger persons or persons moving rapidly may trip the threshold nearer or farther than distance 608 at the same threshold.

In one embodiment, the threshold may be referred to as a "closeness threshold." When the closeness threshold is been violated, the processing system can be configured to cause the user interface and/or the electronic display to be in the active display mode. Violating the threshold may include a sensor response that is at or above the threshold value. In another embodiment, violating a threshold may include a sensor response that is at or above the threshold value for a predetermined time interval. In another embodiment, violating the threshold may require a sensor response to cross the threshold a predetermined number of times.

In embodiments similar to the thermostats described in FIGS. 4A-4B, two different processing functions may be used. The first processing function may include a first processor that is configured to detect when the closeness threshold has been exceeded. The first processing function may then wake the second processing function (which may include a second processor) from a low-power mode in response to the closeness threshold being exceeded. Generally, the second processor may then cause the electronic display to operate in the active mode. The first processing function may include a low-power microcontroller, such as an MSP430. The second processing function may include a higher power microprocessor, such as an ARM processor. The second processing function may operate in a sleep mode, or low power mode, that requires less power than can be reliably supplied by power stealing. The first processing function may operate predominantly in a state that requires less average power than can be supplied by power stealing. When the second processing function is operating in the active mode and the electronic display is operating in the active display mode, these two operations together may require more average power than can be supplied by power stealing.

Although the discussion above concerning thresholds only uses single-value to thresholds, this is merely exemplary. Other embodiments may use multiple thresholds to form what may be called a "proximity profile." A proximity profile may include multiple sensor readings. In one embodiment, a proximity profile may be comprised of a single threshold from a single sensor, while in other embodiments, a proximity profile may be comprised of characteristic responses from multiple sensors. Multiple sensors may be used to further generate an approach signature for users in each particular environment. For example, motion sensors, heat sensors, sound sensors, and/or biometric sensors may all provide responses to the processing function. In turn, the processing function may analyze all of these responses to determine whether they sufficiently match an expected approach signature. If these responses sufficiently match, then the processing function may determine that a user is approaching the thermostat to view the electronic display. Matching the proximity profile may be approximate, and may depend on each particular environment. A proximity profile may be matched if sensors provide responses within a certain range and within a certain delay interval between other sensors providing responses in certain ranges.

Because every environment can be different, the processing system may be configured to intelligently define the proper threshold and possibly to continuously refine the threshold throughout the lifetime of the thermostat to adapt to changing user patterns, locations, and/or environmental conditions within the area being monitored. Turning back to FIG. 6, a proximity sensor associated with responsive area 606 may be used to both detect threshold violations and to define and refine the threshold. As used herein, the term "proximity sensor" may be used to refer to any sensor configured to detect a physical closeness of a user to the user interface of the thermostat. A proximity sensor may include a PIR motion detector, a near field PIR motion detector, and other similar sensors. In one particular embodiment, a proximity sensor may be termed an "active proximity sensor" that can include sensors configured to emit electromagnetic radiation and to receive reflections of electromagnetic radiation from nearby objects. In one embodiment, a proximity sensor may include commercially available sensors, such as the Si1142 from Silicon Labs, and PYD1998, PYD5731, and PYD1794 from Excelitas.

In one embodiment, the processing system can be configured to automatically adjust the closeness threshold based at least in part on historical physical closeness events as detected by one or more proximity sensors. In one embodiment, a "physical closeness event" may include any response recorded by a proximity sensor that may be indicative of a user being within the responsive area of the proximity sensor. In another embodiment, a physical closeness event may include a series of responses from the proximity sensor no user is detected within the responsive area. This second embodiment defines physical closeness events in this manner because a threshold may be set slightly above an ambient noise level, as will be described further below.

In one exemplary situation, a proximity sensor having responsive area 606 may periodically provide sensor readings to the processing system for storage and analysis. When users are not found within the responsive area 606, an ambient noise level may be recorded. When users enter the responsive area 606, a response level may be recorded. Using a history of physical closeness events, the processing system may set a threshold somewhere between the ambient noise level and the response level associated with a user.

In one embodiment, distinguishing between an ambient noise level and a user response level may be difficult using only a single sensor. In this embodiment, one or more additional sensors may be used to distinguish between noise responses and user-based responses in the proximity sensor. For example, a proximity sensor associated with responsive area 606 may be used in conjunction with a physical manipulation sensor on the thermostat 602 and/or a second sensor associated with responsive area 604. Generally, each set of responses from the proximity sensor may be analyzed in conjunction with responses from the one or more additional sensors to determine whether the set of responses should be classified as noise or as a user-based response.

Figure 7:
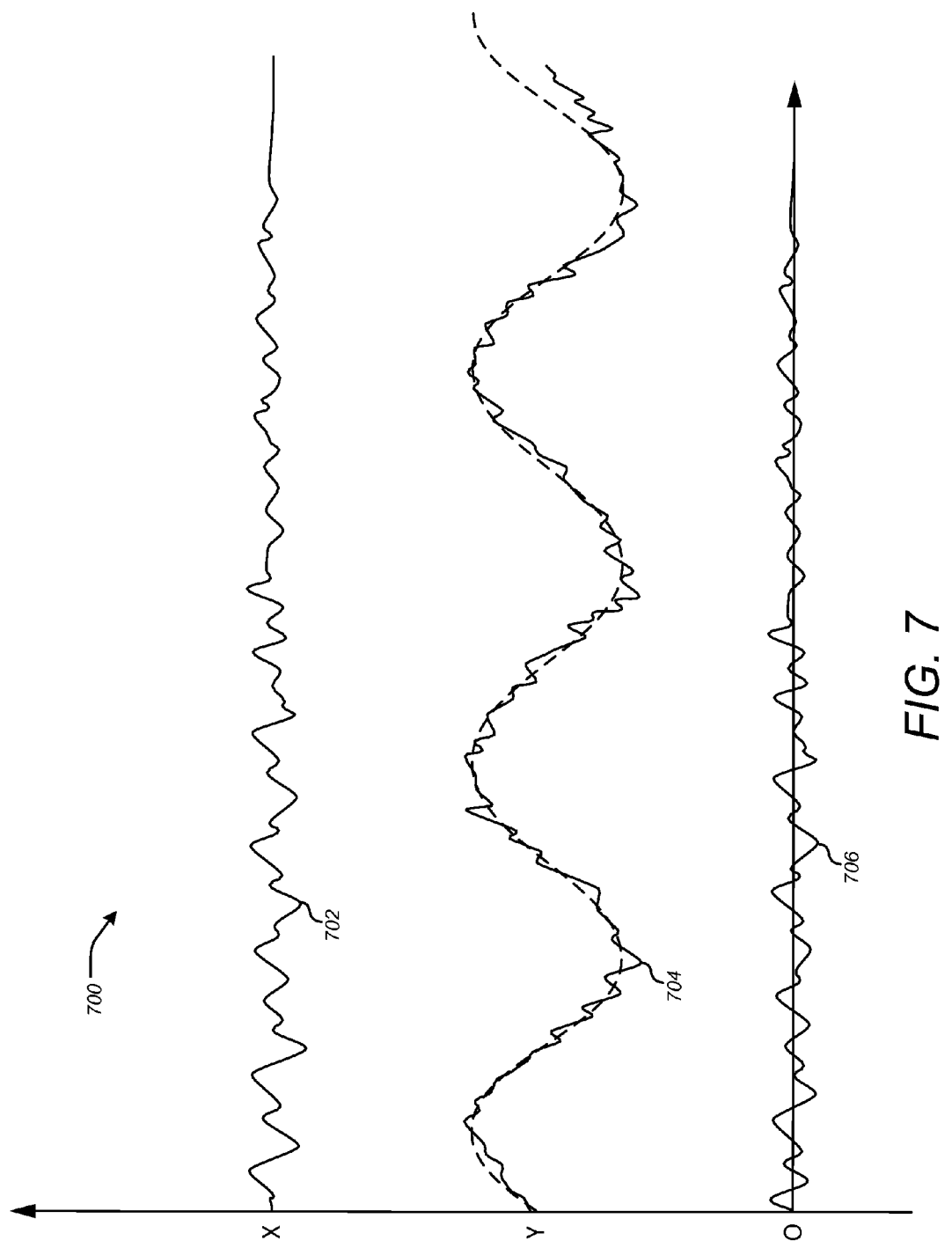
FIG. 7 illustrates a representation of various types of raw sensor responses over a time period, according to one embodiment.

FIG. 7 illustrates a representation 700 of various types of raw sensor responses over a time period, according to one embodiment. A first type of sensor may provide a response 702, while a second type of sensor may provide a response 704. The first response 702 may be characterized as an ambient noise level centered around the value X. The second response 704 may be characterized as an ambient noise level that varies sinusoidally over time with an average value of Y.

In both of these situations, a baselining procedure may be helpful in the thresholding operations described above. In the case of response 702, the average value can be subtracted from the actual sensor response to provide an ambient noise level response that is centered around zero. Similarly in the case of response 704, a high pass filter may be utilized to filter out the sinusoidal drift, and the average value Y may be subtracted from the resulting response to provide an ambient noise level response that is centered around zero. Response 706 may be the result of either one of these operations. It will be understood that other raw sensor responses may also require some sort of baselining procedure. In light of this disclosure, one having skill in the art could readily follow the example of these procedures described above and apply them to various other sensor types.

Figure 8:
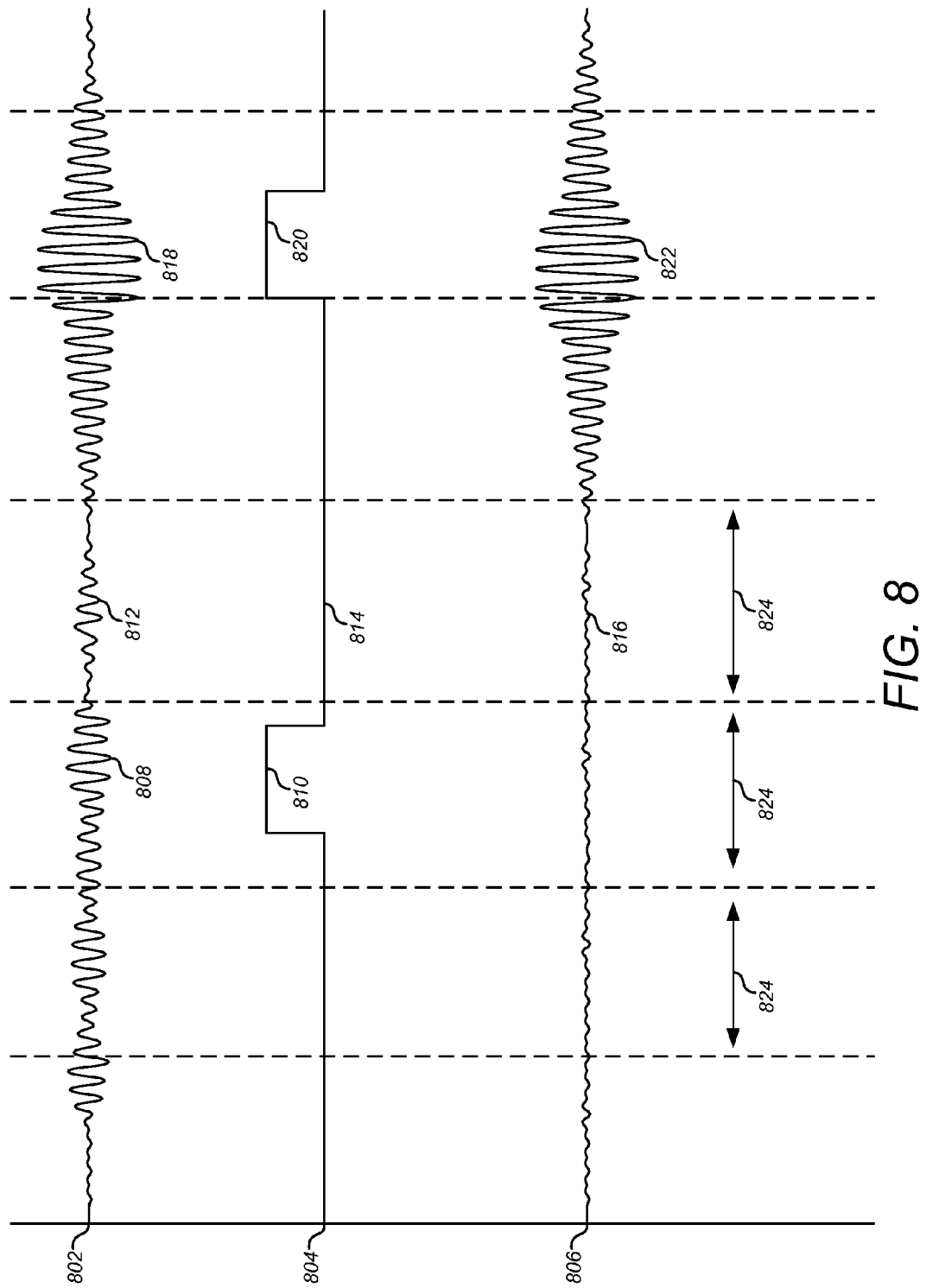
FIG. 8 illustrates a representation of the individual sensor responses for three distinct sensors over the same time interval, according to one embodiment.

FIG. 8 illustrates a representation 800 of the individual sensor responses for three distinct sensors over the same time interval, according to one embodiment. Response 802 may be associated with a first proximity sensor, while response 806 may be associated with a second proximity sensor. In this embodiment, the first proximity sensor may be associated with a responsive area that is smaller than a responsive area associated with the second proximity sensor. The first proximity sensor may comprise a near-field PIR motion sensor, or an active sensor that is configured to emit electromagnetic radiation and receives reflections of the emitted electromagnetic radiation. The second proximity sensor may comprise a regular PIR motion sensor. Response 804 may be associated with a manipulation sensor coupled to a user input of the thermostat. In one embodiment, the manipulation sensor may comprise an optical sensor configured to detect rotation of a ring around the perimeter of the thermostat.

In this embodiment, the manipulation sensor and the second proximity sensor may be used to characterize the responses of the first proximity sensor. In one example, the proximity sensor may detect an event 808 that would seem to indicate a user approaching the thermostat. Turning to the other sensors, the manipulation sensor may also detect an event 810 that coincides with the vent 808 and indicates that a user has physically manipulated the user interface of the thermostat. Response 806 associated with the second proximity sensor does not show an event during the same time interval, which would indicate that a user manipulated the thermostat outside of the range of the second proximity sensor. This situation may occur when the user is standing to the side of the thermostat or behind a wall to which the thermostat is mounted. In analyzing responses 802, 804, and 806, the processing function may determine that event 808 on the proximity sensor is associated with a physical closeness event and an actual manipulation of the thermostat, and is therefore not ambient-level noise.

In another example, response 812 associated with the first proximity sensor may be difficult to classify as either a user-based response or an ambient noise response. By examining responses 814 and 816 associated with the other two sensors, the processing system may determine that event 812 corresponds to ambient noise, because no user was detected by the other two sensors.

In yet another example, event 818 associated with the first proximity sensor seems to indicate that a user has approached the thermostat. Similarly, event 820 associated with the manipulation sensor and event 822 associated with the second proximity sensor also seem to indicate that a user has approached the thermostat. Therefore, in this case, the processing system may readily determine that event 818 corresponds to a user-based event rather than ambient noise.

In yet another example (not shown) an event similar to event 808 could occur in response 802 associated with the first proximity sensor. Around the same time, response 806 of the second proximity sensor could also show event similar to event 822. Both of these events would seem to indicate a user approaching the thermostat. However, response 804 associated with the manipulation sensor could show event similar to event 814 indicating that the user did not manipulate the thermostat. The processing function could then determine that the situation should not be interpreted as a user intending to view the thermostat. In another embodiment, the processing function could also determine that this situation indicates that the user intended to view the electronic display of the thermostat without intending to manipulate the user interface physically. The processing function could then distinguish between these two situations using historical data.

These examples illustrate various ways to determine whether responses of a proximity sensor should be classified as ambient noise or a user approach. These determinations can be used to set a closeness threshold, which when violated would cause the electronic display to operate in the active display mode. In one embodiment, the various sensor readings can be divided into time intervals 824. Portions of response 802 of the first proximity sensor could be excluded if they occur around the same time as responses from one or more of the other sensors. For example, the time intervals that include event 808 and event 818 could be removed from consideration, while leaving the time interval containing event 812. An average value, maximum value, or other statistical characterization of the response within each remaining time interval could be used to set a threshold. In one embodiment, the threshold can be set at the maximum value from the remaining time intervals, signifying the maximum ambient noise level measured. In another embodiment, the threshold can be set at a predetermined level above the average value of the responses in the remaining time intervals. For example, a threshold could be set 20% above the average value of the remaining responses. In other embodiments, a closeness threshold could be set in relation to the responses in the remaining time intervals according to other known methods in light of this disclosure.

Figure 9:
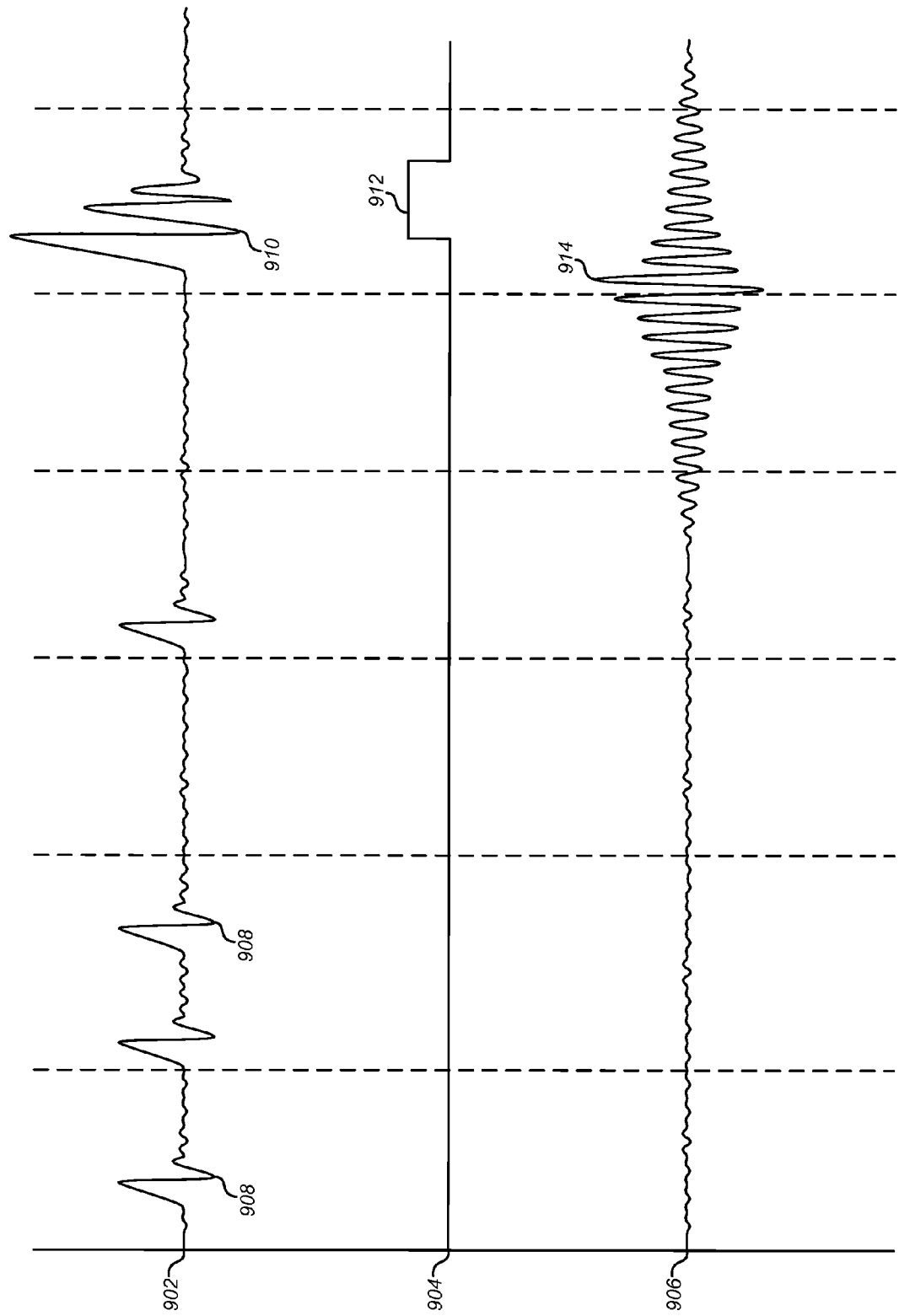
FIG. 9 illustrates a representation of the individual sensor responses from three distinct sensors, where the first proximity sensor includes abnormalities in the noise profile, according to one particular embodiment.

While FIG. 8 illustrated a first proximity sensor with an approximately Gaussian noise distribution centered around a baseline value, other noise profiles may exist in different sensors. FIG. 9 illustrates a representation 900 of the individual sensor responses from three distinct sensors, where the first proximity sensor includes abnormalities in the noise profile, according to one particular embodiment. Response 902 may be associated with the first proximity sensor, and may include events 908 that correspond to noise abnormalities. Events 908 may in some cases strongly resemble a user-based response that would seem to indicate an approaching user. In one particular embodiment, events 908 may result when the first proximity sensor is not serviced at a predetermined time interval. In another embodiment, events 908 may result from the periodic discharge of sample-and-hold circuits. In yet another embodiment, events 908 may result from various other periodic sensor-based operations specific to each type of sensor.

As was the case in the discussion related to FIG. 8, events 908 can be properly characterized as noise rather than user-based events by examining the responses 904, 906 from additional sensors. Again, response 904 may be associated with a manipulation sensor, and response 906 may be associated with a second proximity sensor. Events 908 may be properly classified as noise rather than user-based events because responses 904 and 906 showed no corresponding activity. In contrast, events 910 may be classified as a user-based event by examining events 912 on response 904 along with event 914 on response 906.

When using sensors with noise event similar to events 908, other precautions may be taken, for example, an average value for each time interval may be used rather than a maximum value. The closeness threshold could then be set a predetermined percentage above the maximum noise event level. Alternatively, the closeness threshold could be set a predetermined percentage below the minimum or maximum user-based response level. Either of these types of responses can be referred to as a physical closeness event, depending on the particular embodiment.

In one embodiment where the thermostat comprises a backplate and a head unit and where the backplate includes a first processor and the head unit includes a second processor, the operations of determining, adjusting, and testing the closeness threshold may be divided between the two processors. In one embodiment, the backplate processor may collect data from each of the sensors and provide the data periodically to the head unit processor. The backplate processor may first baseline the sensor data to be centered around zero. The backplate processor may also process the sensor data such that only a maximum, average, median, etc. value is sent for each of a predetermined number of time intervals. The head unit processor may then analyze the sensor data—either raw or processed—and determine a closeness threshold. The closeness threshold may then be sent back to the backplate processor. The backplate processor may then monitor one or more of the sensors, such as a proximity sensor to determine when and if the threshold is violated. When the threshold is determined by the backplate processor to be violated, the backplate processor can wake the head unit processor from a low-power mode, and the head unit processor can instruct the electronic display to operate in an active display mode, if it is not already operating in an active display mode. This arrangement may be advantageous in power-stealing systems to save power.

Figure 10:
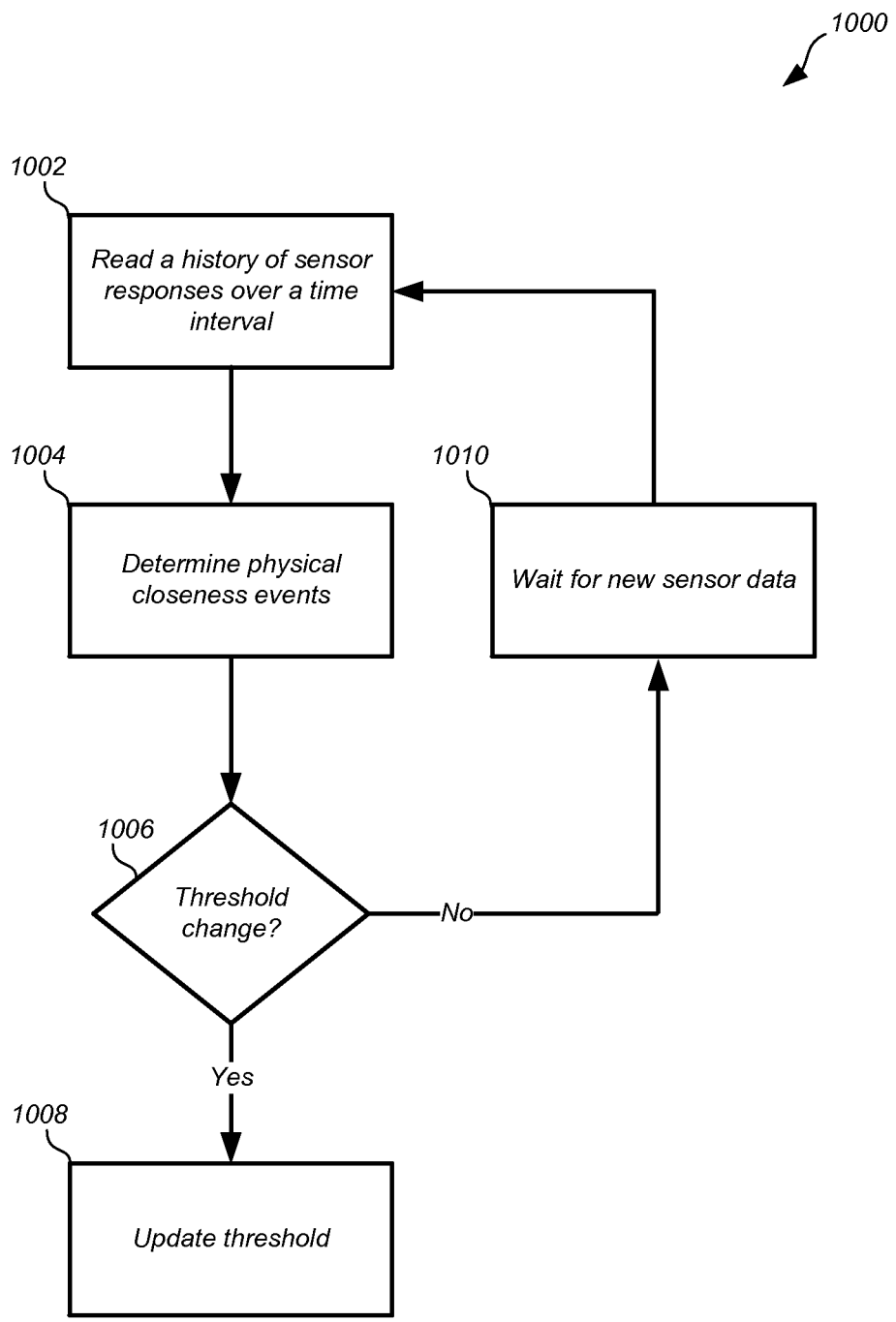
FIG. 10 illustrates a simplified flowchart of a method for optimizing the operation of a user interface of a thermostat by updating a closeness threshold, according to one embodiment.

FIG. 10 illustrates a simplified flowchart 1000 of a method for optimizing the operation of a user interface of a thermostat by updating a closeness threshold, according to one embodiment. The method may include reading a history of sensor measurements over a time interval (1002). In one embodiment, the time interval may be periodic, such that the head unit processor may wake up in response to periodic transmissions from the backplate processor. In another embodiment, the time interval may be based on transitions between a sleep state and an active state of the head unit processor. For example, the backplate processor may send data to the head unit processor each time the head unit processor wakes up, even though this may not be defined by a regular periodic interval, particularly when the head unit processor wakes up to service temperature events and/or user interface manipulation events.

The method may also include determining physical closeness events (1004). In one embodiment, physical closeness events may correspond to sensor responses corresponding to users approaching the thermostat to view the electronic interface. In another embodiment, physical closeness events may correspond to sensor responses corresponding to users actually manipulating the user interface. As described above, physical closeness events associated with a single selected sensor may be determined by examining the responses of other sensors during nearby time intervals. In one embodiment, physical closeness events may then be eliminated from the history of sensor measurements and the threshold may be calculated based on the ambient noise level. In another embodiment, physical closeness events may then be isolated from the history of sensor measurements, and the threshold may be calculated based on user-based response levels.

The method may additionally include determining whether the threshold should be changed (1006). In one embodiment, the threshold need only be changed if the new threshold calculated by the history of sensor measurements over the time interval varies by a certain percentage. For example, the threshold need not change if the new threshold is only 1% more or less than the existing threshold. In another embodiment, the threshold may be updated if there is any change. In yet another embodiment, the newly calculated threshold may be averaged with previous thresholds to lessen the effect of measurement abnormalities. In another embodiment, thresholds that vary by more than a predetermined percentage may be discarded. For example, if a newly calculated threshold is double the existing threshold, the newly calculated threshold may be discarded. The newly calculated threshold may be assigned a weighted value in relation to previous thresholds and the threshold may be updated accordingly. For example, threshold calculated at night may be weighted less than threshold calculated during the day when more activity is expected. In light of this disclosure, one having skill in the art could combine or alter these various methods of determining when and how a threshold should be updated in accordance with the spirit of these embodiments.

If it is determined that the threshold should change, the method may further include updating the threshold (1008). The updated threshold may simply overwrite the previous threshold and a memory location. Alternatively, the updated threshold may be stored in a vector of thresholds such that a history of thresholds is maintained. The history of thresholds may be used to calculate and/or test future calculated thresholds. On the other hand, if it is determined that the threshold should not change, the method may further include waiting for new sensor data (1010). In embodiments where the head unit processor computes new thresholds and determines whether a current threshold should be updated, the head unit processor may enter a sleep state at this point. The backplate processor may then monitor new sensor data and either wake the head unit processor at a regular time interval, or provide a new history of sensor measurements when the head unit processor wakes for other reasons.

In one embodiment, the closeness threshold may be automatically adjusted based at least in part on the joint processing of a number of different factors. One factor may include a historical plurality of closeness events as detected by at least one of the plurality of sensors. Another factor may include a historical plurality of user interface manipulation events, in which the user has actually manipulated the user interface. The closeness threshold can be made less restrictive if there is a higher correlation between physical closeness events and the manipulation events. In other words, a threshold may be lowered if the responses of a first proximity sensor correspond to users actually manipulating the thermostat's user interface. Likewise, the closeness threshold may be made more restrictive if there is a lesser correlation between the physical closeness events and the manipulation events. This may correspond to situations where users often pass by the thermostat without stopping to manipulate the user interface. In these cases, there may not be any reason to turn on the electronic display, and the threshold may be raised in order to require a user to come closer to the thermostat before it enters into the active display mode.

Although the above discussion focuses on a single threshold, it should again be understood that these operations may also apply to a proximity profile that is constructed from one or more sensor responses. In this case, the thresholds or intervals related to each sensor that make up a proximity profile may be updated and adjusted individually in the same manner as described above for single thresholds.

Figure 11:
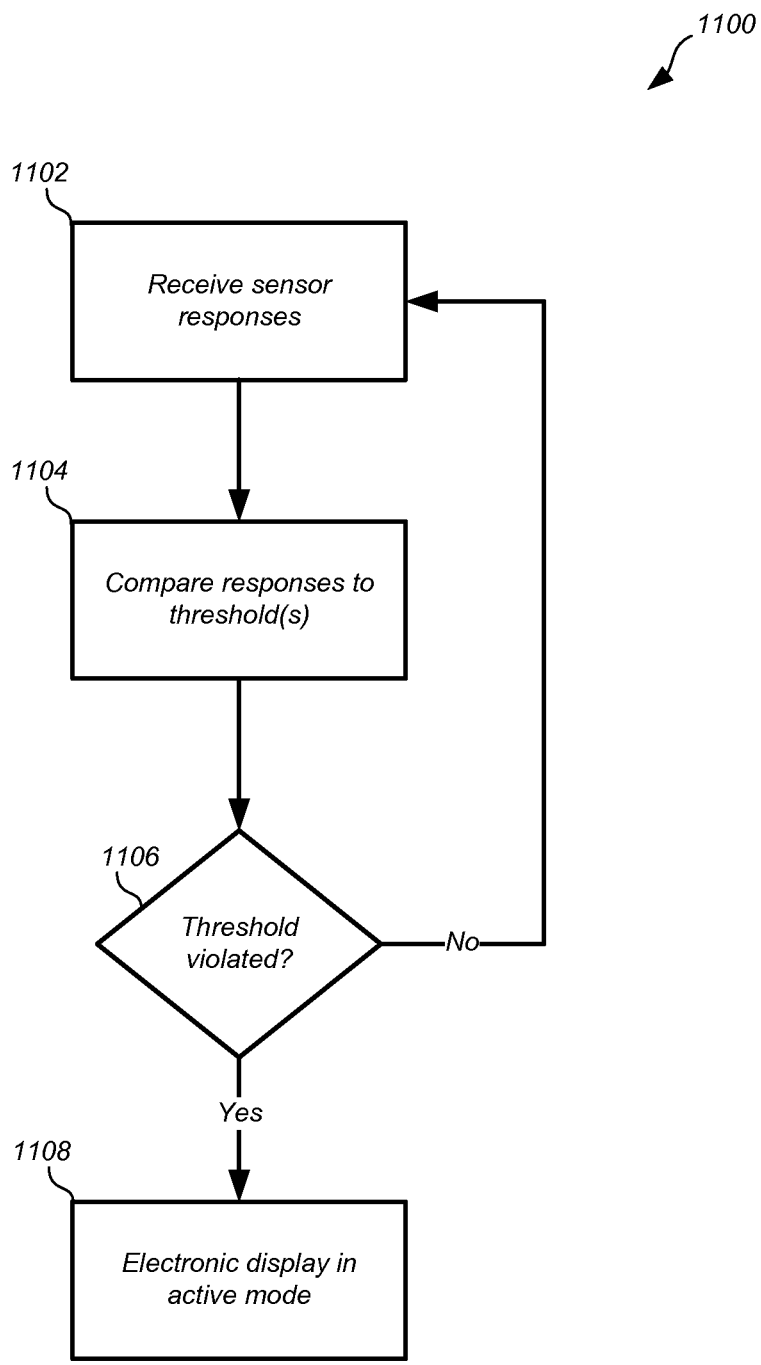
FIG. 11 illustrates a simplified flowchart of a method for determining whether a closeness threshold is violated, according to one embodiment.

FIG. 11 illustrates a simplified flowchart 1100 of a method for determining whether a closeness threshold is violated, according to one embodiment. The method may include receiving sensor responses (1102). The sensor responses may include proximity sensors and/or other sensors as described herein. The method may also include comparing inputs to a threshold (1104). This comparison may be made by a backplate processor without waking a head unit processor or turning on the electronic interface. This comparison may be made periodically for a set of sensor responses, or may be made every time sensor responses are provided to the processing system.

The method may further include determining whether the threshold is violated (1106). In one embodiment, the threshold may be violated if one or more of the sensor responses is greater than or equal to the closeness threshold. In another embodiment, the threshold may be violated if one or more of the sensor responses is less than or equal to the closeness threshold. In another embodiment, the threshold may be violated if a number of sensor responses exceed a number represented by the threshold. In yet another embodiment, the threshold may be violated when the frequency of sensor responses exceeds a threshold frequency, or the number of threshold responses within a time interval exceeds a threshold number. Other methods of violating a threshold are also contemplated by various embodiments, but are not explicitly disclosed here for brevity. However, these various embodiments would be clear to one having skill in the art in light of this disclosure.

If it is determined that a threshold is violated, the method may additionally include causing the electronic display to operate in an active display mode (1108). In one embodiment, if the electronic display is already operating in an active display mode, then no action need be taken. However, if the electronic display is not operating in an active display mode, then the processing system may cause the electronic display to transition into an active display mode. On the other hand, if the threshold is not violated, the processing system may wait for additional sensor responses to compare to the threshold.

Figure 12:
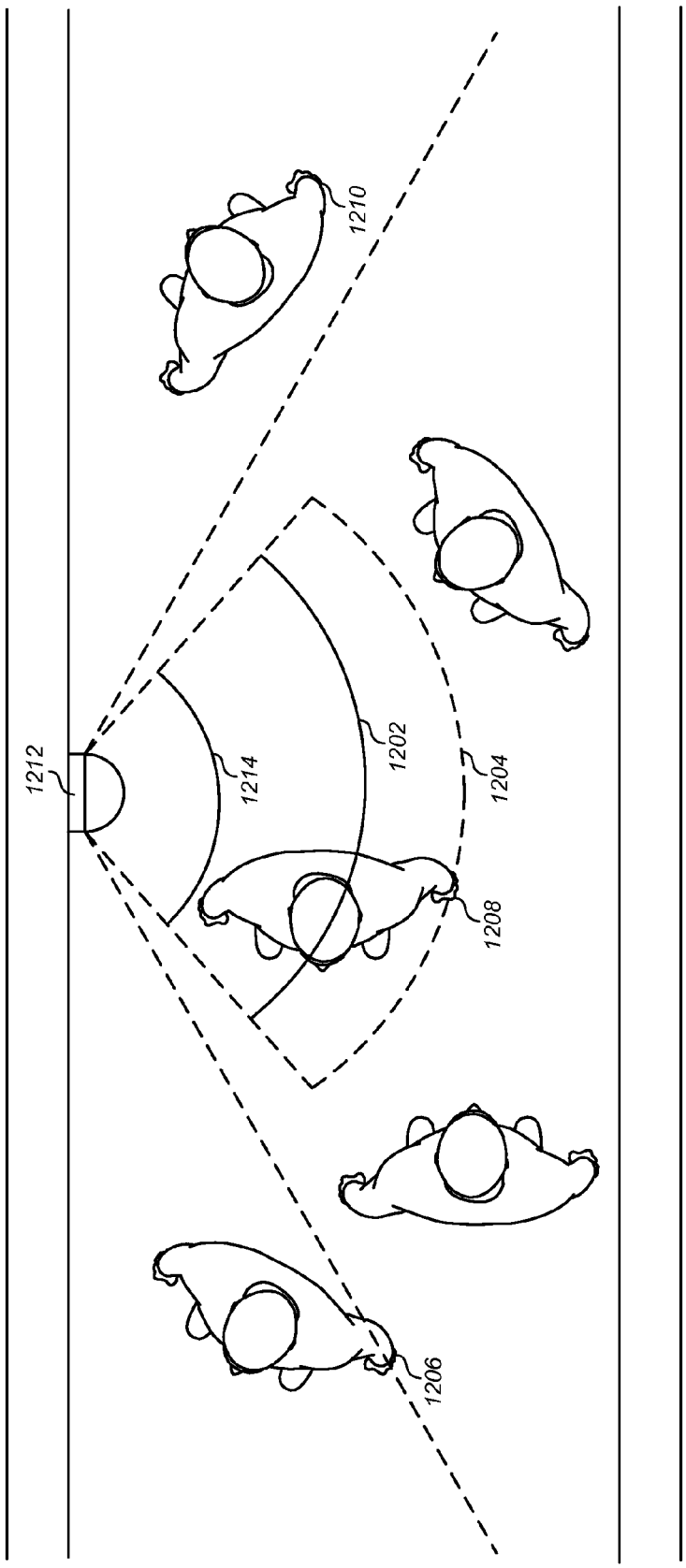
FIG. 12 illustrates an overhead view of a busy hallway problem.

FIG. 12 illustrates an overhead view 1200 of a special circumstance referred to herein as the "busy hallway problem." This problem may be characterized by a large number of physical closeness events within a predetermined time interval that do not correspond to a user wishing to view or manipulate the user interface of the thermostat. The situation may arise in a "busy hallway" or in any other area where people often walk by the thermostat without wanting to interact with the thermostat. As shown in FIG. 12, a threshold may be set corresponding to a distance 1202 for a first proximity sensor with responsive area 1204. Multiple persons, such as person 1206, person 1208, and or person 1210, may walk by the thermostat 1212 in the hallway without intending to view or interact with the user interface.

The problem with this situation is that the thermostat may be fooled into believing that each user approach should cause the electronic display to operate in the active display mode when they violate or exceed the closeness threshold of at least one proximity sensor. If the electronic display were to in fact transition to the active display mode each time the threshold was violated in this situation, the rechargeable battery could eventually drop below a predetermined level corresponding to reliable thermostat operations. In other words, if the electronic display turns on too often it will drain the rechargeable battery below reliable levels.

In order to solve this problem, a predetermined activity threshold may be set. The predetermined activity threshold may correspond to a maximum number of times within a predetermined time interval where the electronic display is allowed to transition into the active state without a corresponding manipulation event of the user interface. In other words, a limit may be set as to the number of times the electronic display can turn on over the course of, for example, 12 hours, without a user actually manipulating the user interface. When this activity threshold is violated, the processing system can require a manipulation event before causing the electronic display to operate in the active display mode.

Additionally, the closeness threshold can be altered such that it is more restrictive when this activity threshold is violated. Thus, the busy hallway situation of FIG. 12 will result in a more restrictive threshold than would normally be computed. For example, the normal closeness threshold calculated in absence of an activity threshold may correspond to distance 1202. In contrast, the closeness threshold may be restricted to distance 1214 when violations of the activity threshold are taken into consideration.

Therefore, in one embodiment the closeness threshold can be automatically adjusted based on a tracked number of times that the electronic display was caused to be in the active display mode in response to physical closeness events over a predetermined time interval. The closeness threshold can be made more restrictive if the tracked number of times was greater than a predetermined activity threshold. This may effectively reduce excessive entry of the electronic display into the active display mode responsive to physical closeness events.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A smart-home device, comprising:
a user interface including an electronic display having a first display mode and a second display mode, the first display mode generally requiring more power than said second display mode;
a processing system coupled to the user interface, the processing system being configured to be in operative communication with one or more environmental sensors for determining at least one environmental condition, and in operative communication with one or more input devices including said user interface; and
at least one sensor configured to detect a physical closeness of a user to the at least one sensor, the at least one sensor being in operative communication with the processing system, the processing system being configured to cause the electronic display to be in the first display mode when a closeness threshold has been exceeded;
wherein said processing system is further configured to automatically adjust said closeness threshold based at least in part on a historical plurality of physical closeness events as detected by the at least one sensor.

2. The smart-home device of claim 1, wherein said closeness threshold is automatically adjusted based on a tracked number of times that the electronic display was caused to be in the first display mode responsive to physical closeness events over a predetermined time interval, the closeness threshold being made more restrictive if said tracked number of times was greater than a predetermined activity threshold, whereby excessive entry of the electronic display into the first display mode responsive to sensed physical closeness events is reduced.

3. The smart-home device of claim 1, wherein said closeness threshold is automatically adjusted based at least in part on a joint processing of (i) the historical plurality of physical closeness events as detected by the at least one sensor, and (ii) a historical plurality of user interface manipulation events in which the user has actually manipulated said user interface, wherein the closeness threshold is made less restrictive if there is a higher correlation between said physical closeness events and said manipulation events, and wherein the closeness threshold is made more restrictive if there is a lesser correlation between said physical closeness events and said manipulation events.

4. The smart-home device of claim 1, wherein said at least one sensor comprises a first sensor and a second sensor, wherein the first sensor is configured to detect the physical closeness of the user to the user interface within a first distance, wherein the second sensor is configured to detect the physical closeness of the user to the user interface within a second distance, and wherein the first distance is greater than the second distance.

5. The smart-home device of claim 4, wherein the first sensor comprises a Passive Infrared sensor (PIR) and the second sensor comprises an active proximity sensor that is configured to emit electromagnetic radiation and to receive reflections of said electromagnetic radiation.

6. The smart-home device of claim 4, wherein the second sensor comprises a near-range PIR.

7. The smart-home device of claim 1 wherein the processing system comprises a first processor and a second processor, wherein the first processor is configured to detect when the closeness threshold has been exceeded and to cause said second processor to transition from a low-power mode in response to the closeness threshold being exceeded, wherein the second processor causes the electronic display to operate in the first display mode.

8. A method for optimizing the operation of a user interface of a smart-home device, the method comprising:
   determining automatically, by a processing system, a closeness threshold based at least in part on a historical plurality of physical closeness events as detected by at least one sensor; the at least one sensor configured to detect a physical closeness of a user to the at least one sensor, the at least one sensor being in operative communication with the processing system;
   detecting a physical closeness of a user to the at least one sensor;
   determining, by the processing system, that the closeness threshold has been exceeded, the processing system being configured to be in operative communication with one or more environmental sensors for determining at least one environmental condition, and in operative communication with one or more input devices including said user interface;
   causing, by the processing system, an electronic display to be in a first display mode when the closeness threshold has been exceeded, the user interface including the electronic display having the first display mode and a second display mode, the first display mode generally requiring more power than said second display mode.

9. The method of claim 8, wherein said closeness threshold is automatically adjusted based on a tracked number of times that the electronic display was caused to be in the first display mode responsive to physical closeness events over a predetermined time interval, the closeness threshold being made more restrictive if said tracked number of times was greater than a predetermined activity threshold, whereby excessive entry of the electronic display into the first display mode responsive to sensed physical closeness events is reduced.

10. The method of claim 8, wherein said closeness threshold is automatically adjusted based at least in part on a joint processing of (i) the historical plurality of physical closeness events as detected by the at least one sensor, and (ii) a historical plurality of user interface manipulation events in which the user has actually manipulated said user interface, wherein the closeness threshold is made less restrictive if there is a higher correlation between said physical closeness events and said manipulation events, and wherein the closeness threshold is made more restrictive if there is a lesser correlation between said physical closeness events and said manipulation events.

11. The method of claim 8, wherein said at least one sensor comprises a first sensor and a second sensor, wherein the first sensor is configured to detect the physical closeness of the user to the user interface within a first distance, wherein the second sensor is configured to detect the physical closeness of the user to the user interface within a second distance, and wherein the first distance is greater than the second distance.

12. The method of claim 11, wherein the first sensor comprises a Passive Infrared sensor (PIR) and the second sensor comprises an active proximity sensor that is configured to emit electromagnetic radiation and to receive reflections of said electromagnetic radiation.

13. The method of claim 11, wherein the second sensor comprises a near-range PIR.

14. The method of claim 8 wherein the processing system comprises a first processor and a second processor, wherein the first processor is configured to detect when the closeness threshold has been exceeded and to cause said second processor to transition from a low-power mode in response to the closeness threshold being exceeded, wherein the second processor causes the electronic display to operate in the first display mode.

15. A smart-home device, comprising:
   a user interface that is configured to operate in at least two different modes comprising:
      a first mode, and
      a second mode, wherein the user interface requires more power when operating in the first mode than in the second mode;
   a plurality of sensors, including at least one sensor configured to detect a presence of a user within a proximity of the smart-home device; and
   a processing function that is configured to determine a proximity profile and to cause the user interface to be in the first mode when one or more of the plurality of sensors provides one or more responses to the processing function that matches the proximity profile, wherein the proximity profile is determined using at least a history of responses from the plurality of sensors that are likely to coincide with times where one or more users intend to view the user interface.

16. The smart-home device of claim 15 further comprising a power stealing circuit configured to supply a first power level, wherein the user interface requires a second power level when operating in the first mode, and wherein the second power level is greater than the first power level.

17. The smart-home device of claim 15 wherein the proximity profile is adjusted based on a power level currently being supplied by a rechargeable battery, whereby the user interface is less likely to be caused to operate in the first mode in response to a physical closeness event.

18. The smart-home device of claim 15 wherein the at least one sensor comprises a first sensor and a second sensor, wherein the first sensor is configured to detect a presence of a user within a first proximity comprising first distance, wherein the second sensor is configured to detect a presence of a user within a second proximity comprising a second distance, and wherein the first distance is greater than the second distance.

19. The smart-home device of claim 15 wherein the processing function comprises a first processor and a second processor, wherein the first processor is configured to determine whether the one or more responses matches the proximity profile, and wherein the second processor is configured to cause the user interface to operate in the first mode.

20. The smart-home device of claim 15 wherein the processing function is further configured to detect when a number of physical closeness events within a predetermined time interval exceed a predetermined activity threshold and adjust the proximity profile in response.

\* \* \* \* \*